(12) United States Patent
Cook et al.

(10) Patent No.: US 9,374,262 B1
(45) Date of Patent: Jun. 21, 2016

(54) TECHNIQUES FOR LINEARIZING PHASE SEPARATELY FROM AMPLITUDE IN A COMMUNICATIONS SYSTEM

(71) Applicant: ViaSat, Inc., Carlsbad, CA (US)

(72) Inventors: Dean L. Cook, Mesa, AZ (US); Bobby D. Andersen, II, Gilbert, AZ (US); Konrad Miehle, Mesa, AZ (US); David E. Pettit, Chandler, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 14/574,951

(22) Filed: Dec. 18, 2014

(51) Int. Cl.
*H04B 15/00* (2006.01)
*H04L 27/36* (2006.01)

(52) U.S. Cl.
CPC .............. *H04L 27/366* (2013.01); *H04B 15/00* (2013.01)

(58) Field of Classification Search
USPC .......................................................... 375/346
See application file for complete search history.

(56) References Cited

U.S. PATENT DOCUMENTS

| | | | | |
|---|---|---|---|---|
| 6,038,262 A * | 3/2000 | Ganter | ..... | H04B 15/00 375/260 |
| 6,711,217 B1 * | 3/2004 | Jeong | ..... | H03F 1/3229 330/149 |
| 6,791,302 B2 * | 9/2004 | Tang | ..... | G05F 3/08 323/272 |
| 2005/0009479 A1 * | 1/2005 | Braithwaite | ..... | H03F 1/3235 455/114.3 |
| 2006/0217083 A1 * | 9/2006 | Braithwaite | ..... | H03F 1/3282 455/114.3 |
| 2008/0085683 A1 * | 4/2008 | Husted | ..... | H04B 1/1027 455/114.3 |
| 2010/0004018 A1 * | 1/2010 | Demir | ..... | H03F 1/3294 455/522 |
| 2010/0184392 A1 * | 7/2010 | Largey | ..... | H04B 17/21 455/115.2 |
| 2010/0222092 A1 * | 9/2010 | Husted | ..... | H04B 1/1027 455/501 |
| 2011/0007647 A1 * | 1/2011 | Miller | ..... | H04B 7/18586 370/252 |
| 2011/0102074 A1 * | 5/2011 | Buer | ..... | H03L 7/18 327/564 |
| 2011/0294528 A1 * | 12/2011 | Husted | ..... | H04B 1/1027 455/501 |
| 2012/0008952 A1 * | 1/2012 | Li | ..... | H04B 10/50 398/65 |
| 2013/0102255 A1 * | 4/2013 | Husted | ..... | H04B 1/1027 455/63.1 |
| 2014/0016723 A1 * | 1/2014 | Mu | ..... | H04B 1/62 375/296 |

* cited by examiner

*Primary Examiner* — Daniel Washburn
*Assistant Examiner* — Berhanu Tadese
(74) *Attorney, Agent, or Firm* — Holland & Hart LLP

(57) ABSTRACT

The present disclosure, for example, relates to one or more techniques for linearizing a signal in a communications system. An input signal may be obtained at a beginning of a signal path of a radio frequency (RF) communication device. The RF communication device may estimate subsequent distortion of the input signal due to the signal path. The estimated distortion may include estimated phase distortion and estimated amplitude distortion of the input signal. The RF communication device may adjust phase and amplitude within the signal path to compensate for the estimated phase distortion and the estimated amplitude distortion to produce an adjusted signal. The phase within the signal path of the input signal may be adjusted separately from the amplitude within the signal path of the input signal. The RF communication device may generate a linearized signal at an end of the signal path based at least in part on the adjusted signal.

23 Claims, 18 Drawing Sheets

TECHNIQUES FOR LINEARIZING PHASE SEPARATELY FROM AMPLITUDE IN A COMMUNICATIONS SYSTEM

BACKGROUND

The present disclosure, for example, relates to communications systems, and more particularly to linearizing signals in a radio frequency (RF) communications system.

Transmitters and receivers of a RF communications system may employ amplitude and phase modulation of a signal. The signal being modulated may become distorted in the transmitter or receiver due to various factors. For example, components of the transmitter or receiver may experience non-linear behaviors when first switched on. The non-linear behavior of the components may cause amplitude and phase distortion of the signal. The amplitude and phase distortion may result in less reliable or slower communication between the transmitter and receiver, as the communication may be dependent upon accurate amplitude and phase modulation.

The phase and amplitude of the signal may be adjusted in the transmitter or receiver to overcome the distortion. For example, the phase and amplitude of the signal may be shaped so that a resulting signal exhibits linear amplitude and phase characteristics. A signal having linear amplitude and phase characteristics may allow for improved reliability and speed of communications between the transmitter and receiver.

Conventional approaches for shaping phase and amplitude may involve complex pre-distortion or feedback schemes to overcome the non-linear behavior of the components of the transmitter or receiver. In these approaches, the shaping of the amplitude and phase may be coupled. A change in amplitude may result in a change in phase, and a change in phase may result in a change in amplitude. This coupling may cause increased difficulty in maintaining both linear amplitude and linear phase at the same time. Therefore, it may be expensive and difficult to overcome the phase and amplitude distortion in transmitters and receivers.

SUMMARY

The present disclosure, for example, provides techniques for linearizing a signal in a communications system. The phase within a signal path of an input signal may be adjusted separately from the amplitude within the signal path of the input signal. The phase and amplitude may be adjusted based on an estimate of distortion due to the signal path of the input signal. A linearized signal may be generated that compensates for the distortions due to the signal path.

In a first set of illustrative examples, a method is described. In one example, the method may include obtaining an input signal at a beginning of a signal path of a radio frequency (RF) communication device; estimating subsequent distortion of the input signal due to the signal path, the estimated distortion comprising estimated phase distortion and estimated amplitude distortion of the input signal; adjusting phase and amplitude within the signal path to compensate for the estimated phase distortion and the estimated amplitude distortion to produce an adjusted signal, wherein the phase is adjusted separately from the amplitude; and generating a linearized signal at an end of the signal path based at least in part on the adjusted signal.

In some examples, at least one of the estimated phase distortion and the estimated amplitude distortion include transient distortion. In some examples, the transient distortion is due at least in part to a start of a pulse of the input signal. In some examples, the transient distortion changes during the pulse of the input signal, and the method further includes modifying at least one of the estimated phase distortion and the estimated amplitude distortion of the pulse due to the changes in the transient distortion; and further adjusting at least one of phase and amplitude of the pulse to compensate for the modified estimated phase distortion and the estimated amplitude distortion. In some examples, the transient distortion is caused at least in part by power supply load changes of the RF communication device. In some examples, the transient distortion is due at least in part to powering up of one or more components of the RF communication device. In some examples, estimating the subsequent distortion includes measuring a characteristic of the RF communication device; and estimating the phase distortion and the amplitude distortion based on the measured characteristic. In some examples, the characteristic is a temperature of the RF communication device.

In some examples, at least part of the distortion of the input signal occurs after the input signal is adjusted. In some examples, generating the linearized signal compensates for phase and amplitude distortion occurring in the signal path. In some examples, adjusting the phase and amplitude of the input signal includes adjusting the phase of the input signal with a phase modification circuit of the RF communication device; and adjusting the amplitude of the input signal with an amplitude modification circuit of the RF communication device, wherein the amplitude adjustment component is separate from the phase adjustment component.

In some examples, adjusting the amplitude of the input signal with the amplitude modification circuit includes modifying the current from a digital current source based at least in part on the estimated amplitude distortion; controlling the gain of a variable gain amplifier based at least in part on the current from the digital current source; and amplifying the input signal with the variable gain amplifier. In some examples, the digital current source comprises a plurality of current sources, and modifying the current from the digital current source includes enabling one or more of the plurality of current sources based at least in part on the estimated amplitude distortion; and combining the currents from the one or more enabled current sources to form the current from the digital current source. In some examples, the variable gain amplifier includes a main amplifier and a secondary amplifier, and controlling the gain of the variable gain amplifier includes modifying the gain of the secondary amplifier based at least in part on the current of the digital current source; and amplifying the input signal with the main amplifier and the secondary amplifier.

In some examples, adjusting the phase of the input signal with the phase modification circuit includes modifying a phase of a signal in a local oscillator (LO) chain of the RF communication device based on the estimated phase distortion; and applying the modified LO signal to the input signal. In some examples, modifying the phase of the LO signal includes shaping a biasing voltage of an amplifier in the LO chain; and saturating at least one subsequent amplifier in the LO chain to preserve the amplitude and modified phase of the LO signal. In some examples, the phase of the LO signal is modified by an output matching network of the LO chain.

In a second set of illustrative examples, a radio frequency (RF) communication device is described. In one example, the RF communication device may include a signal path of an input signal, the signal path including a beginning and an end; a distortion estimation circuit to generate a distortion estimation signal, the distortion estimation signal indicating an estimated distortion of the input signal between the beginning and the end of the signal path, the estimated distortion comprising estimated phase distortion and estimated amplitude distortion of the input signal; an amplitude modification circuit to adjust, based at least in part on the distortion estimation signal, amplitude within the signal path to compensate for the estimated amplitude distortion; and a phase modification circuit to adjust, based at least in part on the distortion estimation signal, phase within the signal path to compensate for the estimated phase distortion, wherein the phase is adjusted separately from the amplitude to generate a linearized signal at the end of the signal path. In some examples of the RF communication device, the RF communication device may implement one or more aspects of the method described above with respect to the first set of illustrative examples.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques are described for linearizing a signal in a radio frequency (RF) communication device. An estimate of the phase distortion and amplitude distortion of a signal path of the RF communication device may be determined. Based on the estimate, the phase and amplitude within the signal may be adjusted to compensate for the distortion. The phase may be adjusted separately from the amplitude in order to provide more accurate compensation of the distortion. In this way, a linearized signal may be generated at an end of the signal path.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
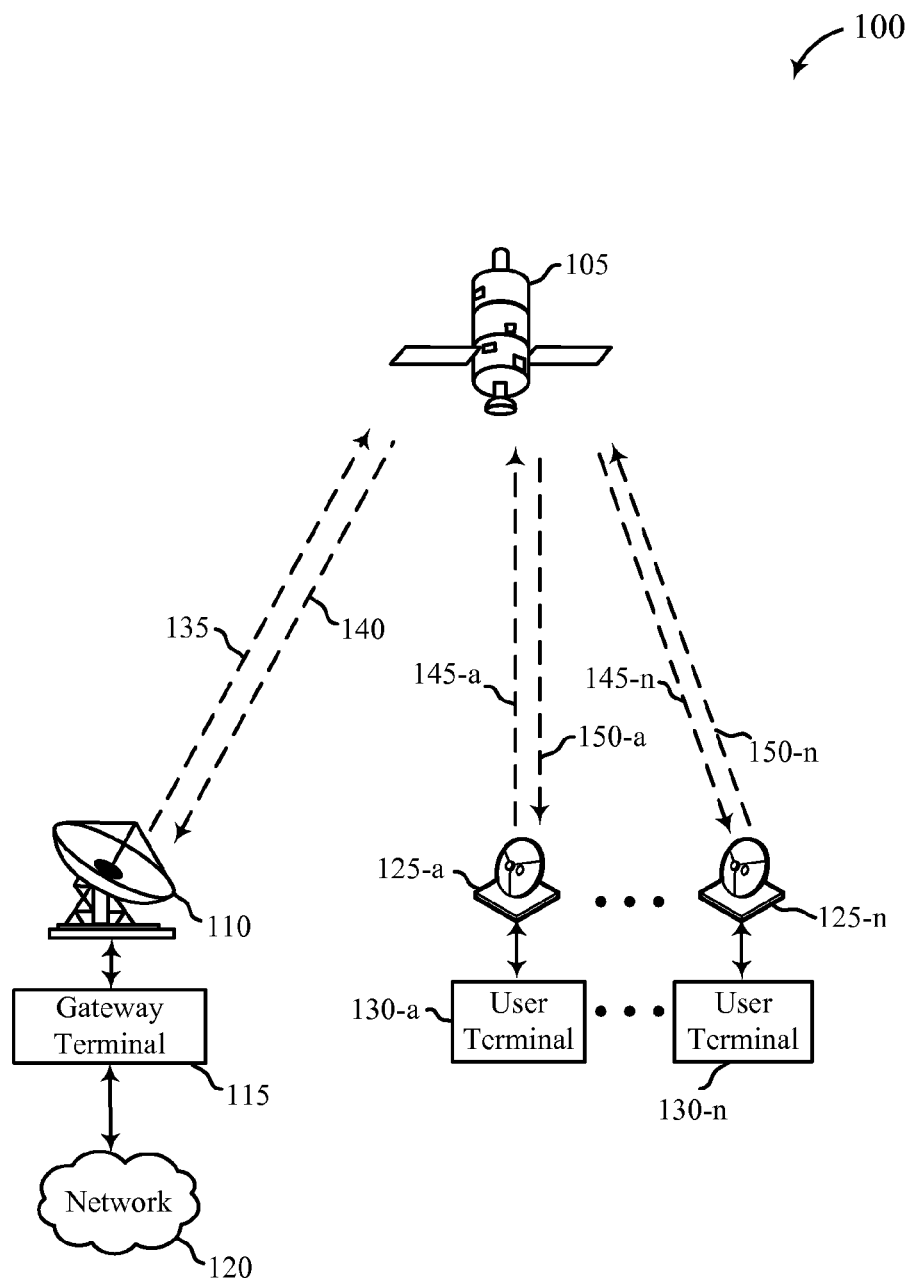
FIG. 1 is a diagram of an exemplary hub-spoke satellite communication system, in accordance with various aspects of the present disclosure.

FIG. 1 is a diagram of an exemplary hub-spoke satellite communication system 100 in accordance with various aspects of the present disclosure. The satellite communication system 100 includes a satellite 105 linking a gateway terminal 115 with one or more user terminals 130. The satellite communication system 100 may use a number of network architectures consisting of space and ground segments. The space segment may include more than one satellite while the ground segment may include a large number of user terminals, gateway terminals, network operations centers (NOCs), satellite and gateway terminal command centers, and the like. These elements are not shown in the figure for clarity.

The gateway terminal 115 is sometimes referred to as a hub or ground station. The gateway terminal 115 may service forward uplink signals 135 to the satellite 105 and return downlink signals 140 from the satellite 105. The gateway terminal 115 may also schedule traffic to the user terminals 130. Alternatively, the scheduling may be performed in other parts of the satellite communication system 100 (e.g., at one or more NOCs and/or gateway command centers neither of which are shown in this example).

The gateway terminal 115 may also provide an interface between a network 120 and the satellite 105. The gateway terminal 115 may receive data and information from the network 120 that is directed to the user terminals 130. The gateway terminal 115 may format the data and information for delivery to the user terminals 130 via the satellite 105. The gateway terminal 115 may also receive signals carrying data and information from the satellite 105. This data and information may be from the user terminals 130 and directed to destinations accessible via the network 120. The gateway terminal 115 may format this data and information for delivery via the network 120.

The network 120 may be any type of network and may include, for example, the Internet, an IP network, an intranet, a wide-area network (WAN), a local-area network (LAN), a virtual private network (VPN), a public switched telephone network (PSTN), a public land mobile network, and the like. The network 120 may include both wired and wireless connections as well as optical links. The network 120 may connect the gateway terminal 115 with other gateway terminals that may be in communication with the satellite 105 or with other satellites.

The gateway terminal 115 may use one or more antennas 110 to transmit the forward uplink signals 135 to the satellite 105 and to receive the return downlink signals 140 from the satellite 105. The antenna 110 shown in FIG. 1 includes a reflector with high directivity in the direction of the satellite 105 and low directivity in other directions. The antenna 110 may be implemented in a variety of alternative configurations and include operating features such as high isolation between orthogonal polarizations, high efficiency in the operational frequency bands, low noise, and the like.

In some satellite communication systems there may be a limited frequency spectrum available for transmission. Forward uplink signals 135 and return downlink signals 140 may use the same, overlapping, or different frequencies compared to the return uplink signals 145 from the user terminals 130 to the satellite 105, and/or forward downlink signals 150 from the satellite 105 to the user terminals 130. In some examples, the gateway terminal 115 may be located away from the user terminals 130, which enables frequency re-use. In other examples, the user terminals 130 may be located near the gateway terminal 115.

The satellite 105 may be a geostationary satellite that is configured to receive and transmit signals. The satellite 105 may receive the forward uplink signals 135 from the gateway terminal 115 and transmit one or more corresponding forward downlink signals 150 to one or more user terminals 130. The satellite 105 may also receive one or more return uplink signals 145 from one or more user terminals 130 and transmit corresponding return downlink signals 140 to the gateway terminal 115.

The satellite communication system 100 may employ spot beam coverage areas with a high degree of frequency reuse. Satellite 105 may utilize a large number of small spot beams covering a large composite area. Each spot beam may carry one or more forward uplink signals 135 and return uplink signals 145. The spot beams may allow for flexible and configurable allocation of bandwidth. In the example shown in FIG. 1, the gateway terminal 115 and the user terminals 130 may be within the same or different spot beams. Each spot beam may use a single carrier (i.e., one carrier frequency), a contiguous frequency range, or a number of frequency ranges.

The satellite communication system 100 may implement fixed spot beams using a fixed multi-beam antenna (MBA) and/or an active phased array antenna (APAA). The MBA may serve fixed beams, and the communications links may be switched over time in a pattern consisting of combinations of forward uplink signals 135 and return uplink signals 145. The APAA may be used as a beam-hopping antenna. The APAA may provision communications between user terminals 130 using two independently steerable beams for each of the transmitting and receiving antennas. Beam steering is achieved by updating pointing directions via control of digital phase shifters in switching interval slots as short as 2 ms in Satellite Switched Time Division Multiple Access (SS-TDMA) mode, where the shortest beam dwell time corresponds to the slot time of the SS-TDMA system. Switching patterns for both the MBA and APAA may be uploaded from the gateway terminal 115.

A high-capacity architecture used in satellite communication system 100 may include small spot beams targeted at fixed locations. Each spot beam may use a large amount of spectrum, for example 250-1000 MHz. The resulting large capacity is a product of several characteristics of the satellite communication system 100, including, for example, (a) the large number of spot beams, typically 60 to 80 or more, (b) the high antenna directivity associated with the spot beams (resulting in, for example, advantageous link budgets), and (c) the relatively large amount of bandwidth used within each spot beam.

The forward downlink signals 150 may be transmitted from the satellite 105 to one or more of the user terminals 130. The user terminals 130 may receive the forward downlink signals 150 using antennas 125. In one example, an antenna and a user terminal together include a very small aperture terminal (VSAT) with the antenna measuring approximately 0.75 meters in diameter and having approximately 2 watts of power. In other examples, a variety of other types of antennas 125 may be used to receive the forward downlink signals 150 from the satellite 105. Each of the user terminals 130 may include a single user terminal or a hub or router coupled to other user terminals. Each of the user terminals 130 may be connected to various consumer premises equipment (CPE) such as computers, local area networks, internet appliances, wireless networks, and the like.

The user terminals 130 may transmit data and information to a destination accessible via the network 120. The user terminals 130 may transmit the return uplink signals 145 to the satellite 105 using the antennas 125. The user terminals 130 may transmit the signals according to a variety of physical layer transmission techniques including a variety of multiplexing schemes and/or modulation and coding schemes. For example, the user terminals 130 may use high speed signal switching for the return uplink signals 145. The switching patterns may support both MBA and APAA systems. When the user terminals 130 use high speed signal switching for the return uplink signals 145, each transmitted signal may be an example of a pulsed RF communication from the user terminal 130.

The user terminals 130 may operate at radio frequency (RF) bands such as Ka band frequencies. The amount of frequency resources and fraction of time a user terminal 130 transmits may determine the capacity of the user terminal 130. The capacity may be changed by changing the fraction of time used for transmissions. This may provide flexibility in allocating capacity between different user terminals both temporally and spatially (e.g., temporally by changing capacity allocation for a particular coverage area over time and spatially by changing capacity allocation for a particular spot beam coverage area over time).

The user terminals 130 may transmit based on a transmit signal switching pattern (e.g., a transmit switching sequence). The switching pattern may be a set of on/off periods versus time during a frame. The user terminals 130 may enable transmissions during the on periods, and may disable transmissions over the spot beam during the off periods. The switching pattern may be synchronized in time with a switching pattern of the satellite 105 or gateway terminal 115. The switching pattern may be stored in memory at the user terminals 130 and may be received from the satellite 105 using a downstream signal that may be either in-band or out-of-band with other downstream signals.

In some examples, user terminals 130 may obtain an input signal. For example, when user terminal 130-a receives forward downlink signal 150-a from the satellite 105, the forward downlink signal 150-a may be the input signal. As another example, prior to transmission of the return uplink signal 145-a to the satellite 105, the return uplink signal 145-a may be the input signal. In some examples, the input signal may be a pulse associated with a pulsed RF communication. For example, a communication may be a pulsed RF communication corresponding to an on period of a user terminal 130. The input signal may experience distortion within the user terminals 130. The distortion may be a result of switching of components in the user terminal 130 for the pulsed communication or characteristics of the input signal. For example, pulsed RF communications may cause various components within the user terminals 130 to be cycled on and off at a rapid frequency. The cycling of the components may introduce transient distortion, and may cause temperature variations within the components of the user terminals 130. The distortion may vary as the temperature of the components fluctuate.

The transient distortion may be caused by small-scale signals that are present in the components of the user terminal 130. The small-scale signals may be caused at least in part by power supply load changes as the components are cycled on and off for the pulsed RF communication. These small-scale signals may dissipate over time. For example, when the components of the user terminal 130 are cycled off, residual voltage or current may be stored in the components of the user terminal 130, such as transistors, capacitors, or inductors. When the components are cycled back on, the residual voltage or current may not have had time to dissipate, which may affect the operating characteristics of the components.

The transient distortion may also include non-linear characteristics of the components of the user terminals 130. The non-linear characteristics may be caused at least in part by powering up of one or more components of the user terminals 130. For example, some components of the user terminals 130, such as capacitors or transistors, may not operate with expected characteristics immediately after being powered on. These components may take time to reach a proper operating temperature and/or power level. Alternatively or in addition, the non-linear characteristics of the components may occur when the input signal is introduced to the signal path, due to the input signal itself. In some examples, these non-linear characteristics may change during the length of the input signal.

The user terminals 130 may estimate the distortion of the input signal due to the signal path. The estimated distortion may include estimated phase distortion and estimated amplitude distortion of the input signal due to the signal path. The user terminals 130 may then adjust the phase and amplitude of the input signal along the signal path to compensate for the estimated phase distortion and the estimated amplitude distortion to produce an adjusted signal. In some examples, at least one of the estimated phase distortion and the estimated amplitude distortion may be modified due to the changes in the transient distortion during a pulse of the input signal. The phase and amplitude within the signal path may be further adjusted to compensate for the modified estimated phase distortion and the estimated amplitude distortion. The phase within the signal path may be adjusted separately from the amplitude. The user terminals 130 may generate a linearized signal at an end of the signal path based at least in part on the adjusted signal.

While the techniques for generating a linearized signal are described with reference to the user terminals 130, similar techniques may be used for generating a linearized signal at the satellite 105 or the gateway terminal 115.

Figure 2:
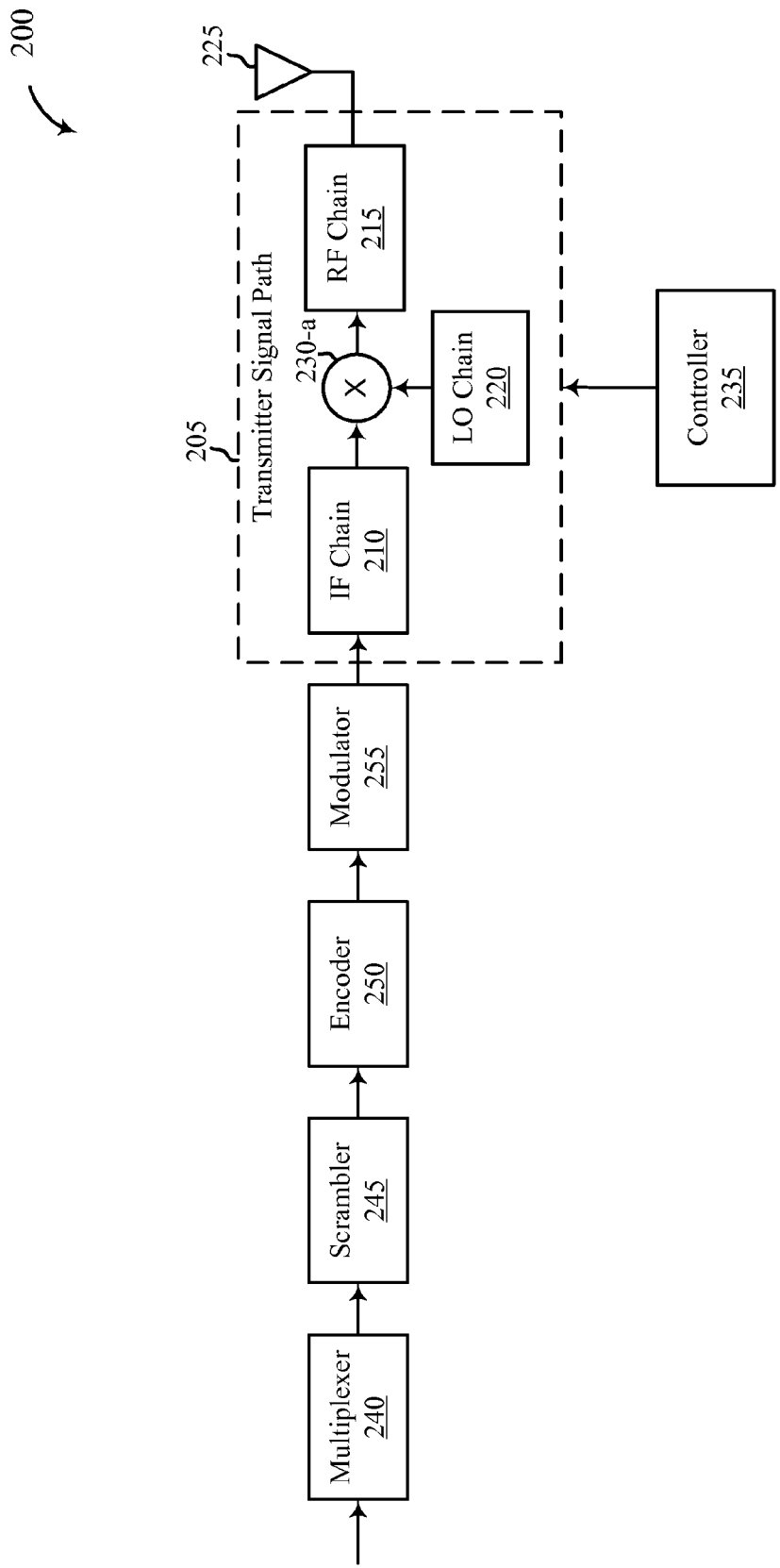
FIG. 2 is a block diagram of an exemplary transmitter for a radio frequency (RF) communication device, in accordance with various aspects of the present disclosure.

FIG. 2 is a block diagram of an exemplary transmitter 200 for a radio frequency (RF) communication device, in accordance with various aspects of the present disclosure. The transmitter 200 may be an example of one or more aspects of the user terminals 130 shown in FIG. 1, or aspects of other RF communication devices. The transmitter 200 may include an intermediate frequency (IF) chain 210, a radio frequency (RF) chain 215, and a local oscillator (LO) chain 220. The IF chain 210 and RF chain 215 may include various filters, amplifiers, and other circuit components for processing and transmitting a signal. The LO chain 220 may include various filters, amplifiers, and other circuit components for generating a LO signal. The LO signal generated by the LO chain 220 may be mixed with a signal from the IF chain 210 in a IF/RF mixer 230 to upconvert the signal to a frequency in the RF spectrum. After filtering and amplification in the RF chain 215, the signal may be transmitted over one or more antennas 225. In some examples, the transmitter 200 may include multiple sets of IF chains 210, RF chains 215, LO chains 220, IF/RF mixers 230, and/or antennas 225.

In some examples, the transmitter 200 may also include a multiplexer 240, a scrambler 245, an encoder 250, and a modulator 255. The multiplexer 240 may multiplex multiple data streams into a single data stream. The scrambler 245 may randomize the single data stream from the multiplexer 240 to improve the energy dispersal of the data stream. The encoder 250 may add error correction and/or encryption to the data stream. The modulator 255 may transform the data stream into a radio signal at an intermediate frequency for further processing and amplification by the IF chain 210-a. In some examples, the transmitter 200 may include multiple multiplexers 240, scramblers 245, encoders 250, and/or modulators 255.

The IF chain 210, RF chain 215, LO chain 220, and IF/RF mixer 230 may be components of a transmitter signal path 205. In some examples, one or more of the multiplexer 240, scrambler 245, encoder 250, modulator 255, and/or other transmitter components (not shown) may also be components of the transmitter signal path 205. The components of the transmitter signal path 205 may be controlled by a controller 235. The controller 235 may enable/disable components of the transmitter 200 based on when the transmitter 200 transmits. For example, the controller 235 may receive scheduling information from a satellite or gateway, and then the controller 235 may enable communications at particular times based on the scheduling information. If the transmitter 200 transmits at a particular time, then the controller 235 may enable the components of the transmitter 200 during the particular time. When the transmitter 200 is not using the components for transmitting during a particular time, then the controller 235 may disable the components. Based on the configuration and timing of the transmissions, the components of the transmitter 200 may be rapidly enabled and disabled by the controller 235.

In some examples, the components that are included within the transmitter signal path 205 and/or the transmitter 200 may be arranged in a different configuration than that shown in the example of FIG. 2. The specific components included in the transmitter signal path 205 and/or transmitter 200 and the configuration of those components may depend on the particular application. In some examples, the transmitter 200 may transmit the return uplink signals 145 shown in FIG. 1, or one or more of the other transmitted signals shown in FIG. 1.

In some examples, the transmitter 200 may obtain an input signal at a beginning of the transmitter signal path 205. In some examples, the input signal may be obtained at the IF chain 210. In other examples, the input signal may be obtained at earlier components of the transmitter 200, such as the modulator 255 or other components (not shown). The input signal may experience distortion along the transmitter signal path 205. In some aspects, rapid enabling and disabling of the components may cause the distortion within the transmitter signal path 205.

The transmitter 200 may estimate the distortion of the input signal introduced along the transmitter signal path 205. The estimated distortion may include estimated phase distortion and estimated amplitude distortion of the input signal. The transmitter 200 may then adjust the phase and amplitude within the transmitter signal path 205 to compensate for the estimated phase distortion and the estimated amplitude distortion to produce an adjusted signal. For example, the phase and amplitude may be adjusted such that a signal output by the transmitter 200 is linearized. The linearized signal may exhibit approximately linear amplitude and phase characteristics.

In some examples, the transmitter 200 may modify at least one of the estimated phase distortion and the estimated amplitude distortion due to the changes in the transient distortion over time. The transmitter 200 may then further adjust the phase and amplitude within the transmitter signal path 205 to compensate for the modified estimated phase distortion and the estimated amplitude distortion.

The phase within the transmitter signal path 205 may be adjusted separately from the amplitude within the transmitter signal path 205. Adjusting the phase and amplitude separately may allow the transmitter 200 to compensate for phase distortion without effecting the amplitude of the input signal, or to compensate for amplitude distortion without effecting the phase of the input signal. This may result in the transmitter 200 producing a more accurate output signal than a transmitter that adjusts amplitude and phase simultaneously. The output of the RF chain 215 may be a linearized signal that is based at least in part on the adjusted signal. In some examples, the linearized signal may be the return uplink signal 145 shown in FIG. 1, or one or more of the other transmitted signals shown in FIG. 1.

Figure 3:
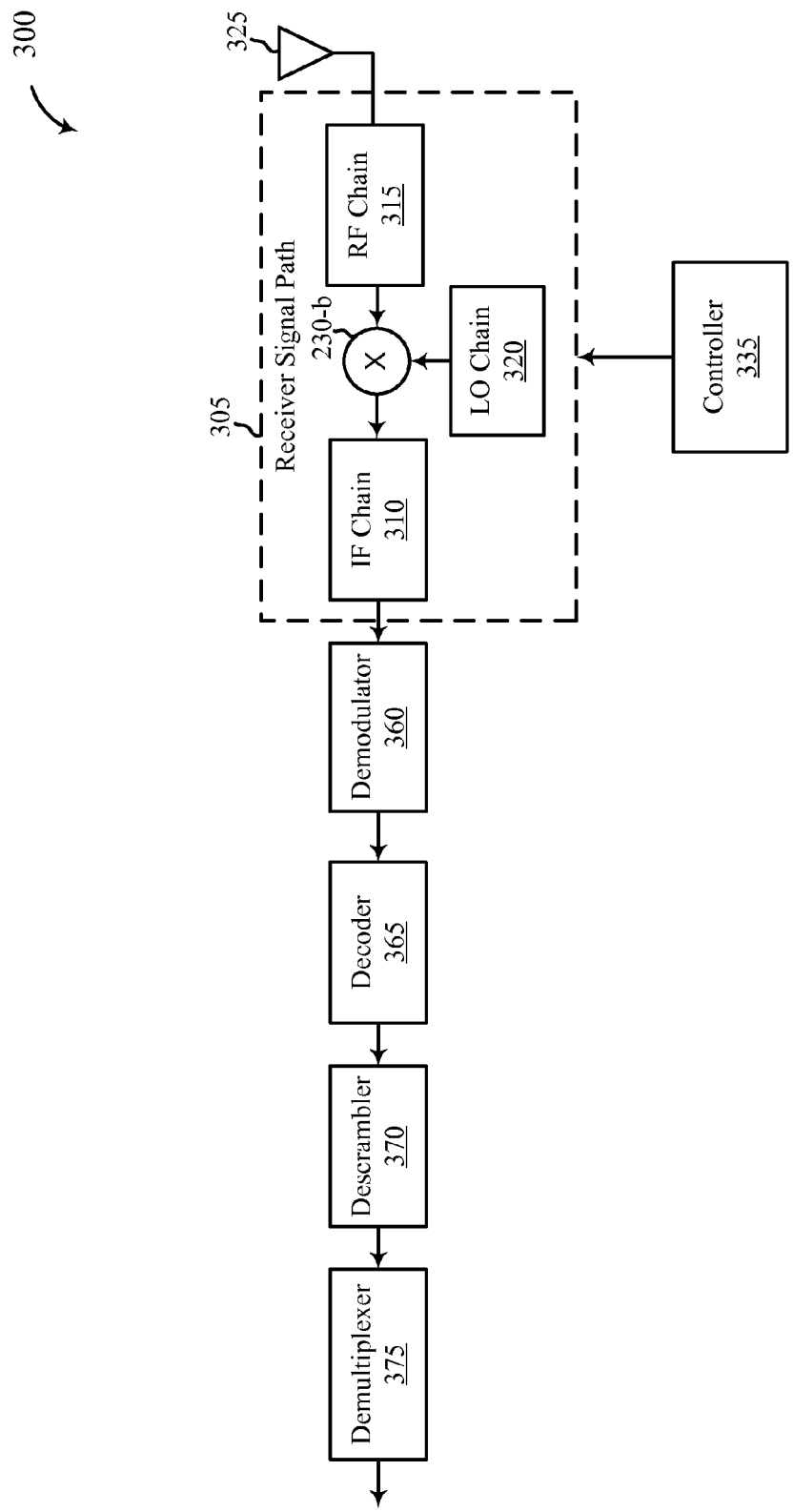
FIG. 3 is a block diagram of an exemplary receiver for a RF communication device, in accordance with various aspects of the present disclosure.

FIG. 3 is a block diagram of an exemplary receiver 300 for a radio frequency (RF) communication device, in accordance with various aspects of the present disclosure. The receiver 300 may be an example of one or more aspects of the user terminals 130 shown in FIG. 1, or aspects of other RF communication devices. The receiver 300 may include an intermediate frequency (IF) chain 310, a radio frequency (RF) chain 315, and a local oscillator (LO) chain 320. The IF chain 310 and RF chain 315 may include various filters, amplifiers, and other circuit components for receiving and processing a signal. The LO chain 320 may include various filters, amplifiers, and other circuit components for generating a LO signal. The LO signal generated by the LO chain 320 may be mixed with an RF signal from the RF chain 315 in a IF/RF mixer 330 to downconvert the signal to an intermediate frequency for further filtering and amplification by the IF chain 310. The RF signal may be received over one or more antennas 325. In some examples, the receiver 300 may include multiple sets of IF chains 310, RF chains 315, LO chains 320, IF/RF mixers 330, and/or antennas 325.

In some examples, the receiver 300 may also include a demodulator 360, a decoder 365, a descrambler 370, and a demultiplexer 375. The demodulator 360 may transform the IF signal from the IF chain 310 into a data stream. The decoder 365 may decrypt and/or apply error correction to the data stream. The descrambler 370 may restore the data stream to its original order before being scrambled by the transmitter 200. The demultiplexer 375 may demultiplex the single data stream from the descrambler 370 into multiple data streams. In some examples, the receiver 300 may include multiple demultiplexers 375, descramblers 370, decoders 365, and/or demodulators 360.

The IF chain 310, RF chain 315, LO chain 320, and IF/RF mixer 330 may be components of a receiver signal path 305. In some examples, the demodulator 360 and/or other receiver components (not shown) may also be components of the receiver signal path 305. The components of the receiver signal path 305 may be controlled by a controller 335. The controller 335 may enable/disable components of the receiver 335 based on when the receiver 300 receives a signal. If the receiver 300 is scheduled to receive at a particular time, then the controller 335 may enable the components of the receiver signal path 305 during the particular time. When the receiver 300 is not using the components of the receiver signal path 305 for receiving during a particular time, then the controller 335 may disable the components. Based on the configuration and timing of the reception, the components of the receiver signal path 305 may be rapidly enabled and disabled by the controller 335. The components being rapidly enabled/disabled may cause the distortion within the receiver signal path 305.

In some examples, the components that are included within the receiver signal path 305 and/or the receiver 300 may be arranged in a different configuration than that shown in the example of FIG. 3. The specific components included in the receiver signal path 305 and/or the receiver 300 and the configuration of those components may depend on the particular application. In some examples, the receiver 300 may receive the forward downlink signals 150 shown in FIG. 1, or one or more of the other received signals shown in FIG. 1.

The receiver 300 may obtain an input signal at a beginning of the receiver signal path 305. The receiver 300 may then use techniques similar to the techniques described in reference to the transmitter 200 to generate a linearized signal. The linearized signal may be the output of the IF chain 310. Alternatively, the output of other receiver components, such as the demodulator 260, may be the linearized signal.

Figure 4:
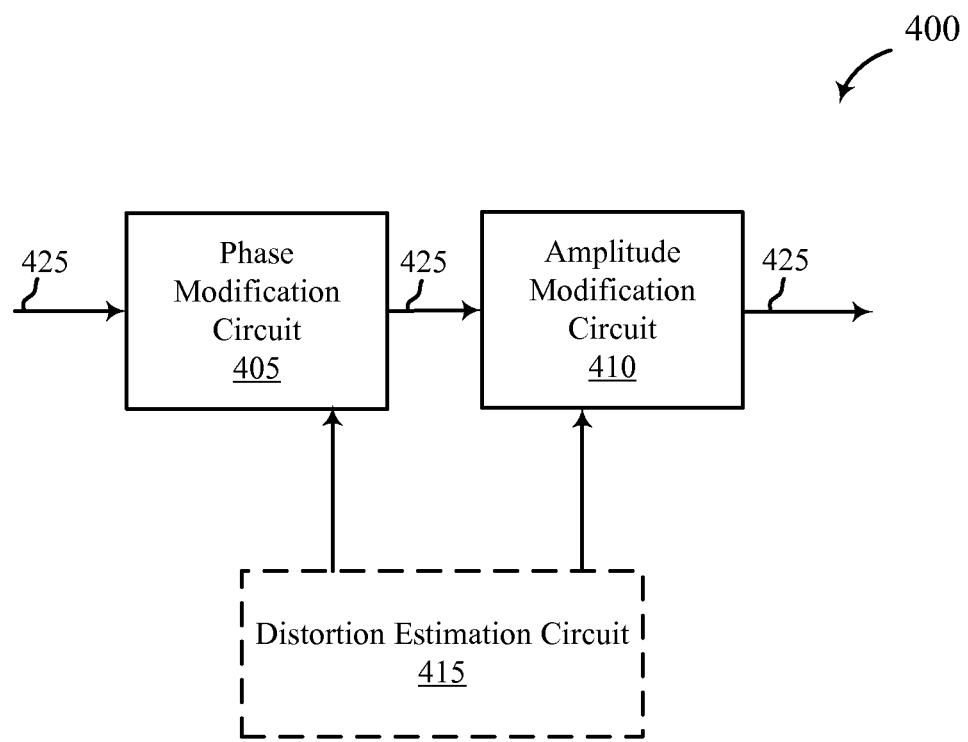
FIG. 4 is another block diagram of an exemplary transceiver chain for a RF communication device, in accordance with various aspects of the present disclosure.

FIG. 4 is a block diagram 400 of an exemplary radio frequency (RF) communication device, in accordance with various aspects of the present disclosure. The RF communication device may be an example of the user terminals 130 described with reference to FIG. 1, or an example of a device used for other communications systems. The RF communication device may include a transceiver chain 420 that may be an example of one or more aspects of the IF chains 210, 310 or RF chains 215, 315 described with reference to FIGS. 2 and 3.

The RF communication device may include a phase modification circuit 405 and an amplitude modification circuit 410. The phase modification circuit 405 and the amplitude modification circuit 410 may be implemented in the IF chains 210, 310 or RF chains 215, 315 described with reference to FIGS. 2 and 3. In some examples, the phase modification circuit 405 may follow the amplitude modification circuit 410. A distortion estimation circuit 415 may perform estimates of phase and amplitude distortion along a signal path 425. The distortion estimation circuit 415 may be a circuit of the RF communication device or a circuit separate from the RF communication device.

The signal path 425 may include the phase modification circuit 405 and the amplitude modification circuit 410. The signal path 425 may also include other components of the RF communication device (not shown). The phase modification circuit 405 may adjust the phase within the signal path 425. The amplitude modification circuit 410 may adjust the amplitude within the signal path 425. The phase and amplitude adjustments may be in response to one or more distortion estimation signals generated by the distortion estimation circuit 415. The one or more distortion estimation signals may indicate an estimate of the amplitude and phase distortion along the signal path 425. In some examples, the distortion estimation circuit 415 may provide the same distortion estimation signals to both the phase modification circuit 405 and the amplitude modification circuit 410. Alternatively, the distortion estimation circuit 415 may provide a phase distortion estimation signal to the phase modification circuit 405 and an amplitude distortion estimation signal to the amplitude modification circuit 410. The phase modification circuit 405 may adjust the phase within the signal path 425 separately from the amplitude. The phase adjustments performed by the phase modification circuit 405 may be based on an estimate of the phase distortion from the distortion estimation circuit 415. The amplitude adjustments performed by the amplitude modification circuit 410 may be based on an estimate of the amplitude distortion from the distortion estimation circuit 415.

The distortion estimation circuit 415 may perform the estimates of the phase and amplitude distortion due to the signal path 425. The distortion estimation circuit 415 may provide one or more amplitude distortion estimation signals to the amplitude modification circuit 410 and one or more phase distortion estimation signals to the phase modification circuit 405. The distortion estimation circuit 415 may include transient distortion in the estimation of the phase and amplitude distortion. The distortion estimation signals provided by the distortion estimation circuit 415 may be shaped based on the estimates of the phase and amplitude distortion due to the signal path 425. For example, if the phase and amplitude distortion due to the signal path 425 are estimated to have non-linear behaviors over time, then the distortion estimation signals may be shaped to compensate for the estimated non-linear behavior.

In some examples, the distortion estimation circuit 415 may estimate the phase and amplitude distortion using a characteristic of the RF communication device. The characteristic may be the temperature of the components of the RF communication device and/or the small-scale signals present in the components of the RF communication. The temperature may for example be measured using one or more temperature sensors within the RF communication device. The distortion estimation circuit 415 may evaluate the characteristic of the RF communication device to determine the distortion estimates. For example, the distortion estimation circuit 415 may use a look-up table to determine the distortion estimates based on the characteristic. In some examples, the distortion estimation circuit 415 may estimate the phase and amplitude distortion based on a feedback signal from the RF communication device. Alternatively, the estimates of the phase and amplitude distortion provided by the distortion estimation circuit 415 may be based on predetermined distortion characteristics of the RF communication device. For example, the estimates of the phase and amplitude distortion may be based on the measured distortion of the RF communication device during a calibration process. As another example, the estimates of the phase and amplitude distortion may be based on the measured distortion characteristics of a representative RF communication device. The circuit details of the distortion estimation circuit 415 may vary from embodiment to embodiment. In one embodiment, the distortion estimation circuit 415 includes a controller that generates the one or more distortion estimation signals. The controller may include memory for storage of data and applications, and a processor for accessing data and executing applications to control operation of the phase modification circuit 405 and the amplitude modification circuit 410. More generally, the functions of the distortion estimation circuit 415 may be implemented in hardware, software executed by a processor, firmware, or any combination thereof.

The phase modification circuit 405 and the amplitude modification circuit 410 may compensate for the estimated phase and amplitude distortion in such a way as to allow the RF communication device to generate a linearized signal at an end of the signal path 425. The linearized signal may have a substantially linear amplitude and phase. The circuit details of the distortion estimation circuit 415 may vary from embodiment to embodiment. In one embodiment, the distortion estimation circuit 415 includes a controller that generates the one or more distortion estimation signals. The controller may include memory for storage of data and applications, and a processor for accessing data and executing applications to control operation of the phase modification circuit 405 and the amplitude modification circuit 410. More generally, the functions of the distortion estimation circuit 415 may be implemented in hardware, software executed by a processor, firmware, or any combination thereof.

Figure 5A:
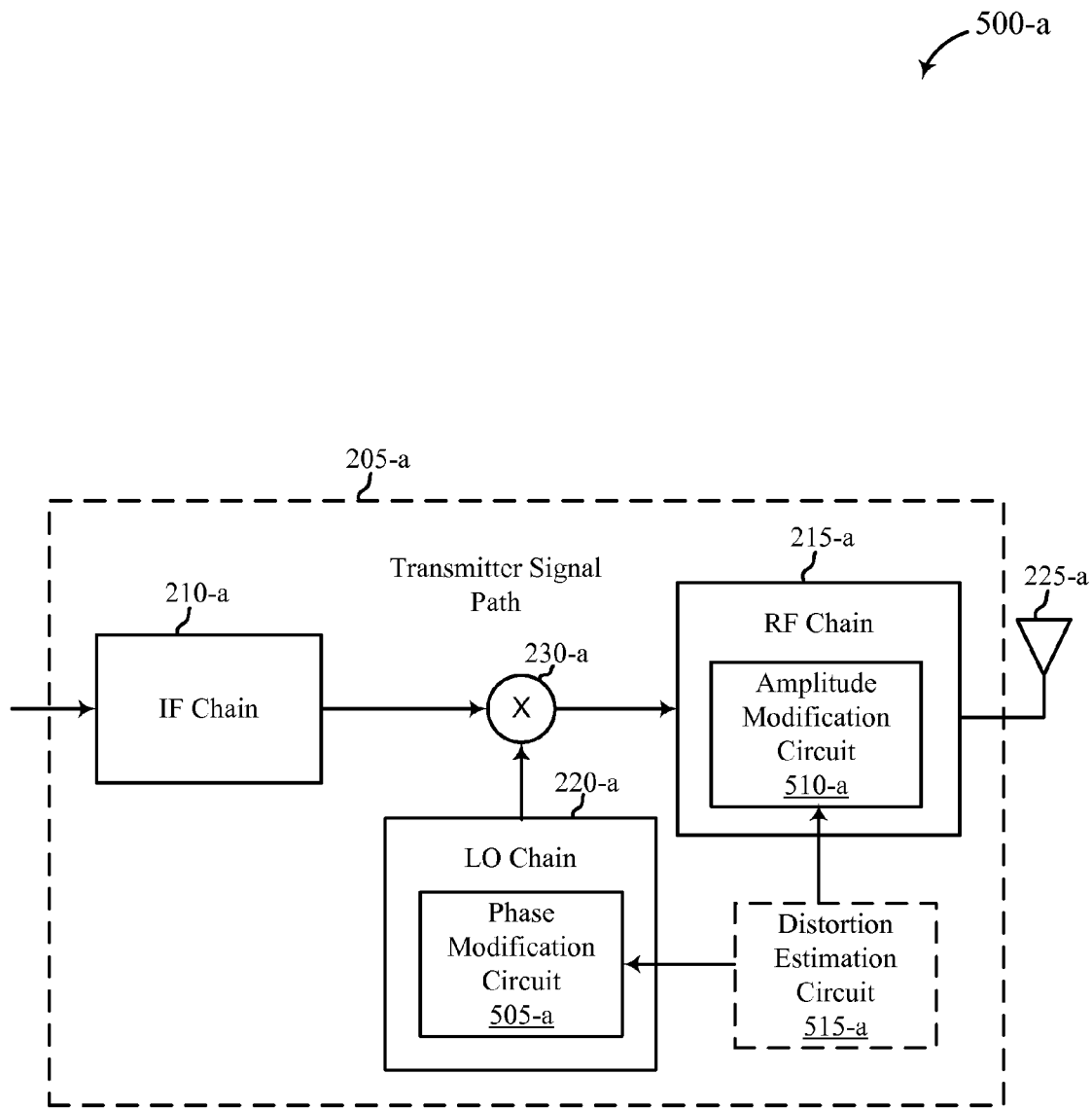
FIG. 5A is a block diagram of an exemplary transmitter signal path for a RF communication device, in accordance with various aspects of the present disclosure.

FIG. 5A is a block diagram 500-a of an exemplary transmitter signal path 205-a for a radio frequency (RF) communication device, in accordance with various aspects of the present disclosure. The RF communication device may be an example of the user terminals 130 described with reference to FIG. 1, or an example of a device used for other communications systems. The transmitter signal path 205-a may be an example of one or more aspects of the transmitter signal path 205 described with reference to FIG. 2. As described in FIG. 2, in some examples, the transmitter signal path 205-a may include additional components, such as a modulator 255 and/or other transmitter components.

The transmitter signal path 205-a may include an IF chain 210-a, an RF chain 215-a, an LO chain 220-a, an antenna 225-a, and a IF/RF mixer 230-a. The RF chain 215-a may include an amplitude modification circuit 510-a. The amplitude modification circuit 510-a may adjust the amplitude within the transmitter signal path 205-a in the RF chain 215-a. The LO chain 220-a may include a phase modification circuit 505-a. The phase modification circuit 505-a may modify the phase of a LO signal in the LO chain 220-a. The phase within the transmitter signal path 205-a may then be adjusted by mixing the modified LO signal with the input signal in the IF/RF mixer 230-*a*. In this way, the phase modification circuit 505-*a* may adjust the phase within the transmitter signal path 205-*a* separately from the amplitude within the transmitter signal path 205-*a*.

The phase adjustments performed by the phase modification circuit 505-*a* may be based on an estimate of the phase distortion due to the signal path 205-*a* of the input signal. The amplitude adjustments performed by the amplitude modification circuit 510-*a* may be based on an estimate of the amplitude distortion due to the signal path 205-*a* of the input signal. The phase and amplitude adjustments may be in response to one or more distortion estimation signals generated by a distortion estimation circuit 515-*a*. The one or more distortion estimation signals may indicate an estimate of the amplitude and phase distortion along the signal path 205-*a*. In some examples, the distortion estimation circuit 515-*a* may provide the same distortion estimation signals to both the phase modification circuit 505-*a* and the amplitude modification circuit 510-*a*. Alternatively, the distortion estimation circuit 515-*a* may provide a phase distortion estimation signal to the phase modification circuit 505-*a* and an amplitude distortion estimation signal to the amplitude modification circuit 510-*a*.

The distortion estimation circuit 515-*a* may perform the estimates of the phase and amplitude distortion due to the signal path 205-*a*. The distortion estimation circuit 515-*a* may be a circuit of the RF communication device or a circuit separate from the RF communication device. The distortion estimation circuit 515-*a* may provide the one or more amplitude distortion estimation signals to the amplitude modification circuit 510-*a* and the one or more phase distortion estimation signals to the phase modification circuit 505-*a*. The distortion estimation circuit 515-*a* may include transient distortion in the estimation of the phase and amplitude distortion. The distortion estimation signals provided by the distortion estimation circuit 515-*a* may be shaped based on the estimates of the phase and amplitude distortion due to the signal path 205-*a*. For example, if the phase and amplitude distortion due to the signal path 205-*a* are estimated to have non-linear behaviors over time, then the distortion estimation signals may be shaped to compensate for the estimated non-linear behavior.

In some examples, the distortion estimation circuit 515-*a* may estimate the phase and amplitude distortion using a characteristic of the RF communication device. The characteristic may be the temperature of the components of the RF communication device or the small-scale signals present in the components of the RF communication. The temperature may for example be measured using one or more temperature sensors within the RF communication device. The distortion estimation circuit 515-*a* may evaluate the characteristic of the RF communication device to determine the distortion estimates. For example, the distortion estimation circuit 515-*a* may use a look-up table to determine the distortion estimates based on the characteristic. In some examples, the distortion estimation circuit 515-*a* may estimate the phase and amplitude distortion based on a feedback signal from the RF communication device. Alternatively, the estimates of the phase and amplitude distortion provided by the distortion estimation circuit 515-*a* may be based on predetermined distortion characteristics of the RF communication device. For example, the estimates of the phase and amplitude distortion may be based on the measured distortion of the RF communication device during a calibration process. As another example, the estimates of the phase and amplitude distortion may be based on the measured distortion characteristics of a representative RF communication device.

The phase modification circuit 505-*a* and the amplitude modification circuit 510-*a* may compensate for the estimated phase and amplitude distortion in such a way as to allow the RF communication device to generate a linearized signal at an end of the signal path 205-*a*. The linearized signal may have a substantially linear amplitude and phase.

Figure 5B:
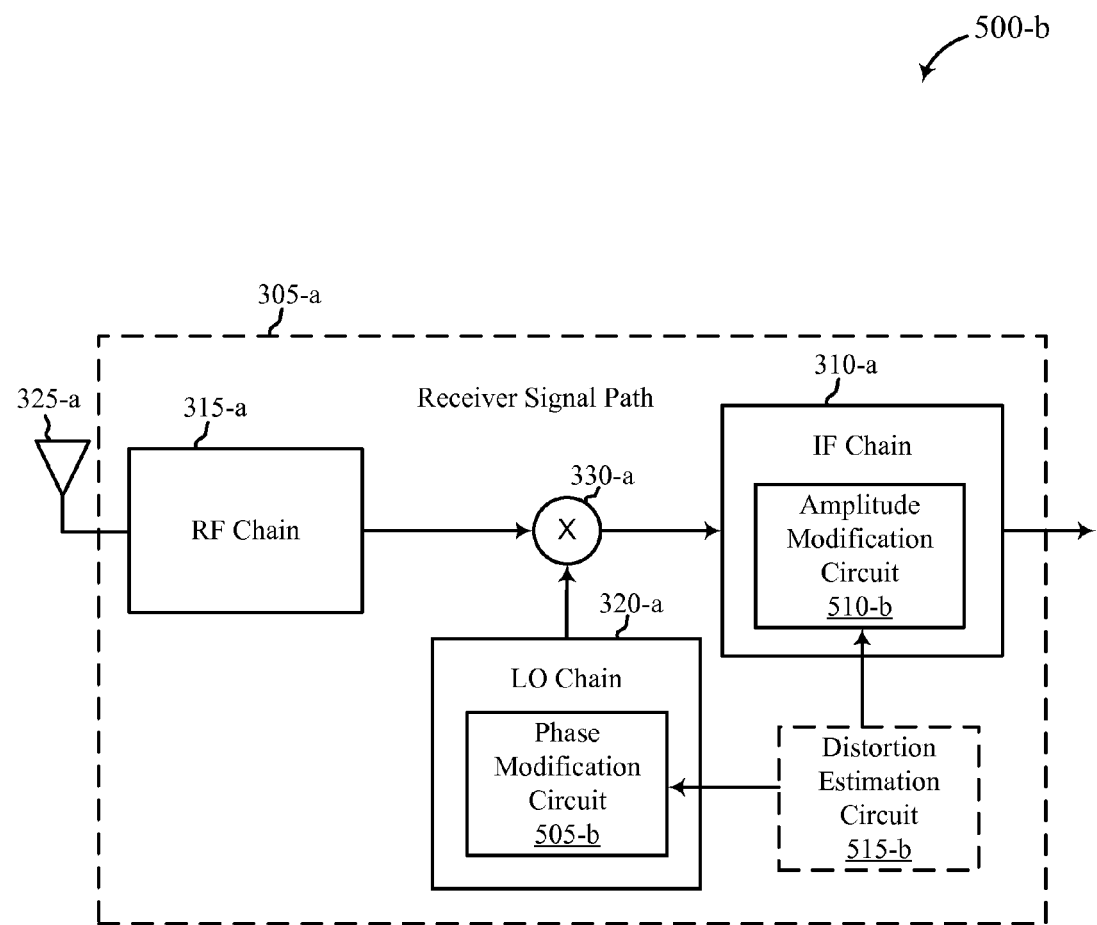
FIG. 5B is a block diagram of an exemplary receiver signal path for a RF communication device, in accordance with various aspects of the present disclosure.

FIG. 5B is a block diagram 500-*b* of an exemplary receiver signal path 305-*a* for a radio frequency (RF) communication device, in accordance with various aspects of the present disclosure. The RF communication device may be an example of the user terminals 130 described with reference to FIG. 1, or an example of a device used for other communications systems. The receiver signal path 305-*a* may be an example of one or more aspects of the receiver signal path 305 described with reference to FIG. 3. As described above with reference to FIG. 3, the receiver signal path 305-*a* may include additional components, such as a demodulator 360 and/or other transmitter components, in some examples.

The receiver signal path 305-*a* may include an IF chain 310-*a*, an RF chain 315-*a*, an LO chain 320-*a*, an antenna 325-*a*, and an IF/RF mixer 330-*a*. The IF chain 310-*a* may include an amplitude modification circuit 510-*b*. The LO chain 320-*a* may include a phase modification circuit 505-*b*. A distortion estimation circuit 515-*b* may perform estimates of the phase and amplitude distortion due to the signal path 305-*a*. The distortion estimation circuit 515-*b* may be a circuit of the RF communication device or a circuit separate from the RF communication device. The distortion estimation circuit 515-*b* may be an example of distortion estimation circuits 415 or 515-*a* of FIG. 4 or 5A.

The phase modification circuit 505-*b* and the amplitude modification circuit 510-*b* may compensate for the estimated phase and amplitude distortion using techniques similar to the techniques described in reference to FIGS. 3, 4 and 5A to generate a linearized signal at an end of the signal path 305-*a*. The linearized signal may have a substantially linear amplitude and phase.

Figure 6A:
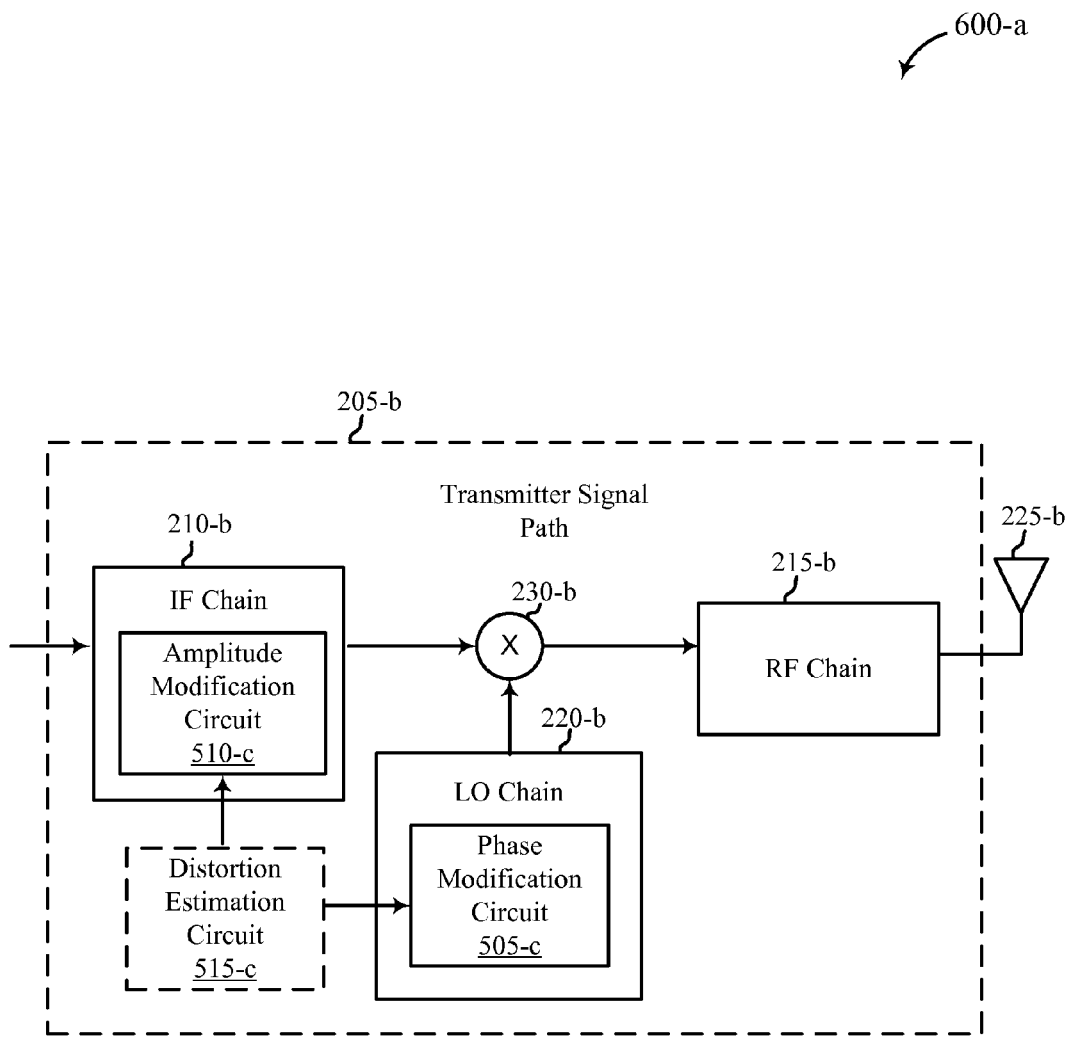
FIG. 6A is another block diagram of an exemplary transmitter signal path for a RF communication device, in accordance with various aspects of the present disclosure.

FIG. 6A is a block diagram 600-*a* of an exemplary transmitter signal path 205-*b* for a radio frequency (RF) communication device, in accordance with various aspects of the present disclosure. The RF communication device may be an example of the user terminals 130 described with reference to FIG. 1, or an example of a device used for other communications systems. The transmitter signal path 205-*b* may be an example of one or more aspects of the transmitter signal path 205 described with reference to FIG. 2. As described in FIG. 2, in some examples, the transmitter signal path 205-*b* may include additional components, such as a modulator 255 and/or other transmitter components.

The transmitter signal path 205-*b* may include an IF chain 210-*b*, an RF chain 215-*b*, an LO chain 220-*b*, an antenna 225-*b*, and an IF/RF mixer 230-*b*. In contrast to FIG. 5A, the IF chain 210-*b* in FIG. 6A may include an amplitude modification circuit 510-*c*. The LO chain 220-*b* may include a phase modification circuit 505-*c*. A distortion estimation circuit 515-*c* may perform estimates of the phase and amplitude distortion due to the signal path. The distortion estimation circuit 515-*c* may be a circuit of the RF communication device or a circuit separate from the RF communication device. The distortion estimation circuit 515-*c* may be an example of distortion estimation circuits 415 or 515 of FIG. 4, 5A or 5B.

The phase modification circuit 505-*c* and the amplitude modification circuit 510-*c* may compensate for the estimated phase and amplitude distortion using techniques similar to the techniques described in reference to FIGS. 2 and 5A to generate a linearized signal at an end of the signal path. The linearized signal may have a substantially linear amplitude and phase.

Figure 6B:
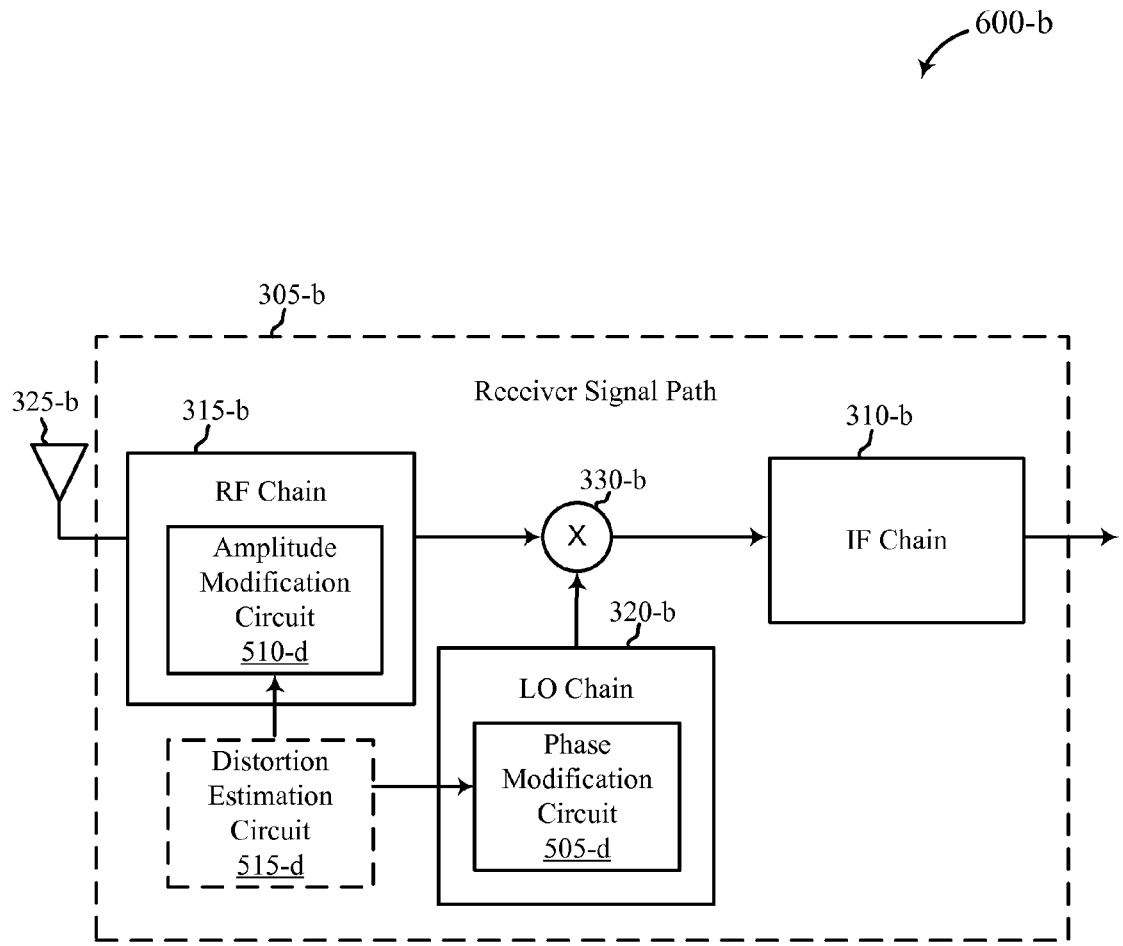
FIG. 6B is another block diagram of an exemplary receiver signal path for a RF communication device, in accordance with various aspects of the present disclosure.

FIG. 6B is a block diagram 600-*b* of an exemplary receiver signal path 305-*b* for a radio frequency (RF) communication device, in accordance with various aspects of the present disclosure. The RF communication device may be an example of the user terminals 130 described with reference to FIG. 1, or an example of a device used for other communications systems. The receiver signal path 305-*b* may be an example of one or more aspects of the receiver signal path 305 described with reference to FIG. 3. As described in FIG., in some examples, the receiver signal path 305-*b* may include additional components, such as a demodulator 360, and/or other transmitter components.

The receiver signal path 305-*b* may include an IF chain 310-*b*, an RF chain 315-*b*, an LO chain 320-*b*, an antenna 325-*b*, and an IF/RF mixer 330-*b*. In contrast to FIG. 5B, the RF chain 315-*b* in FIG. 6B may include an amplitude modification circuit 510-*d*. The LO chain 320-*b* may include a phase modification circuit 505-*d*. A distortion estimation circuit 515-*d* may perform estimates of the phase and amplitude distortion due to the signal path 305-*b*. The distortion estimation circuit 515-*d* may be an example of distortion estimation circuits 415 or 515 of FIG. 4, 5A or 5B.

The phase modification circuit 505-*d* and the amplitude modification circuit 510-*d* may compensate for the estimated phase and amplitude distortion using techniques similar to the techniques described in reference to FIGS. 3 and 5B to generate a linearized signal at an end of the signal path 305-*b*. The linearized signal may have a substantially linear amplitude and phase.

Figure 7:
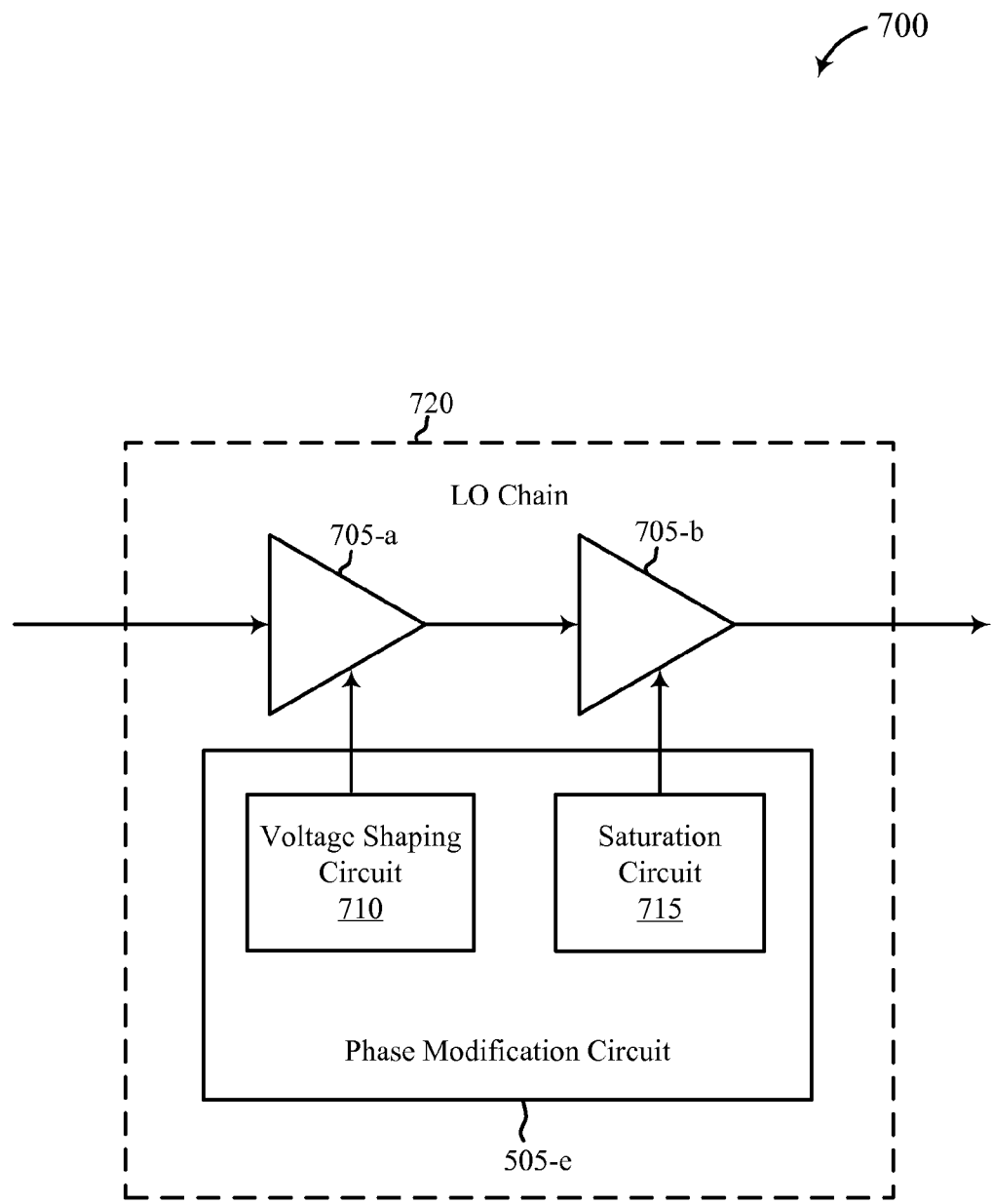
FIG. 7 is a block diagram of an exemplary LO chain for a RF communication device, in accordance with various aspects of the present disclosure.

FIG. 7 is a block diagram 700 of an exemplary LO chain 720 for a radio frequency (RF) communication device, in accordance with various aspects of the present disclosure. The RF communication device may be an example of the user terminals 130 described with reference to FIG. 1, or an example of a device used for other communications systems. The LO chain 720 may be an example of one or more aspects of LO chains 220 or 320 described with reference to FIGS. 2, 3, 5A, 5B, 6A, and 6B.

The LO chain 720 may include a phase modification circuit 505-*e* and amplifiers 705-*a* and 705-*b*. The phase modification circuit 505-*e* may include a voltage shaping circuit 710 and a saturation circuit 715. A LO signal may be input into the first amplifier 705-*a*. The voltage shaping circuit 710 of the phase modification circuit 505-*e* may modify the phase of the LO signal by shaping the biasing voltage of the first amplifier 705-*a*. The phase of first amplifier 705-*a* may change as the biasing voltage is changed. For example, the biasing voltage may be a drain voltage of an field effect transistor (FET) amplifier. The saturation circuit 715 may then saturate the second amplifier (and any subsequent amplifiers in the LO chain 720) to preserve the amplitude and modified phase of the LO signal. The phase of the LO signal may be modified such that, when mixed with the input signal, the phase of the input signal is adjusted to compensate for the estimated phase distortions of the signal path. By modifying the phase of the LO signal in the LO chain 220-*g*, the phase of the input signal may be adjusted separately from the amplitude.

Figure 8:
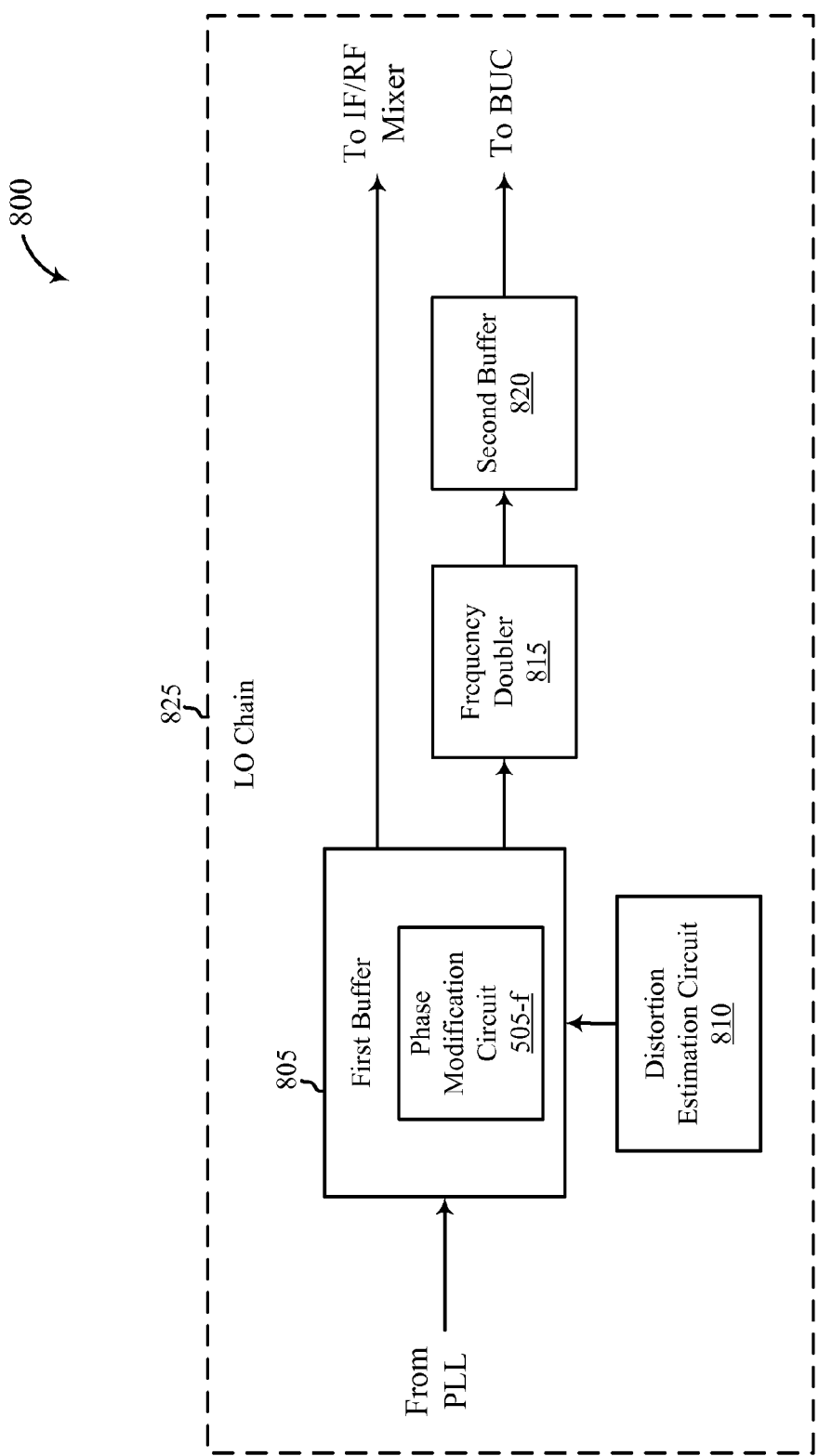
FIG. 8 is a block diagram of another exemplary LO chain for a RF communication device, in accordance with various aspects of the present disclosure.

FIG. 8 is a block diagram 800 of another exemplary LO chain 825 for a radio frequency (RF) communication device, in accordance with various aspects of the present disclosure. The RF communication device may be an example of user terminals 130 described with reference to FIG. 1, or an example of a device used for other communications systems. The LO chain 825 may be an example of one or more aspects of LO chains 220, 320, or 720 described with reference to FIGS. 2, 3, 5A, 5B, 6A, 6B, and 7.

The LO chain 825 may include a first buffer 805, a distortion estimation circuit 810, a frequency doubler 815, and a second buffer 820. The first buffer 805 may be, for example, a 10 GHz amplifier. The first buffer 805 may include a phase modification circuit 505-*f*. A LO signal from a phase locked loop (PLL) may be input into the first buffer 805. The phase modification circuit 505-*f* of the first buffer 805 may modify the phase of the LO signal based on a control voltage from a distortion estimation circuit 810. The control voltage from the distortion estimation circuit 810 may be based on the estimated phase distortions of the signal path. In some examples, the first buffer 805 may output the modified LO signal to an IF/RF mixer, where the modified LO signal may be applied to the input signal. The phase modification circuit 505-*f* may modify the phase of the LO signal such that, when mixed with the input signal in the IF/RF mixer, the phase of the input signal is adjusted to compensate for the phase distortions of the signal path.

In some examples, the first buffer 805 may also output the modified LO signal to the frequency doubler 815. The frequency doubler 815 may upconvert the frequency of the modified LO signal to twice the original frequency. Upconverting the frequency of the modified LO signal may cause further modifications to the phase of the LO signal. For example, the frequency doubler 815 may increase the phase change applied by the phase modification circuit 505-*f* by a factor of two. The frequency doubler 815 may output the upconverted LO signal to the second buffer 820. The second buffer 820 may be, for example, a 20 GHz amplifier. The second buffer 820 may send the upconverted LO signal to a block upconverter (BUC) of the RF communication device. As the phase-modified LO signal propagates through the multiple upconverters (e.g., the frequency doubler 815 and the BUC), the phase change applied by the phase modification circuit 505-*f* may increase. For example, the phase change applied by the phase modification circuit 505-*f* may increase by a factor of three after further upconverting in the BUC. In this way, the phase modification circuit 505-*f* may compensate for a relatively large phase distortion in the signal path by applying a relatively small phase change in the LO chain.

Figure 9:
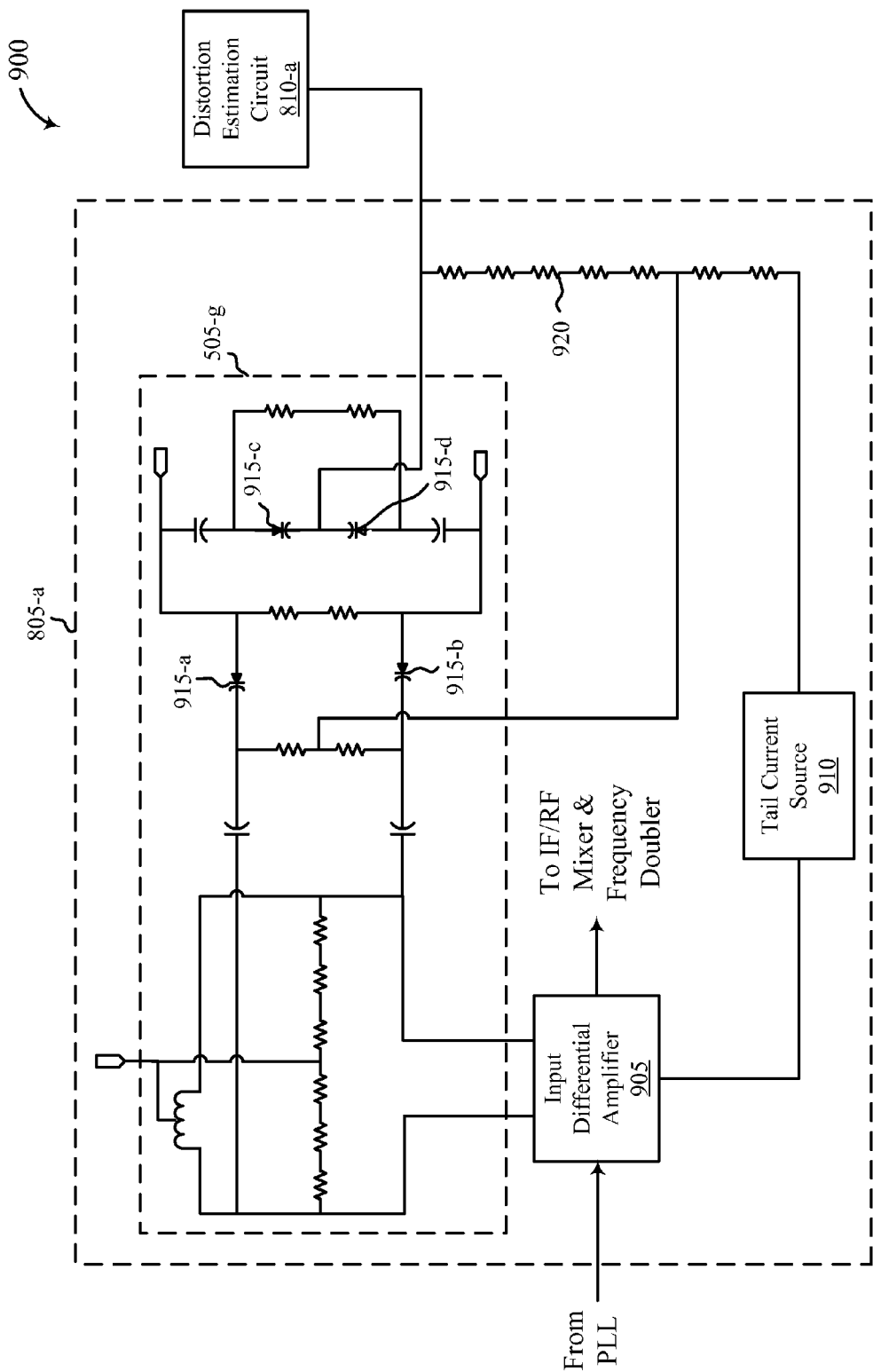
FIG. 9 is a block diagram of an exemplary buffer in the LO chain of a RF communication device, in accordance with various aspects of the present disclosure.

FIG. 9 is a block diagram 900 of an exemplary buffer 805-*a* in the LO chain of a radio frequency (RF) communication device, in accordance with various aspects of the present disclosure. The RF communication device may be an example of the user terminals 130 described with reference to FIG. 1, or an example of a device used for other communications systems. The LO chain may be an example of one or more aspects of LO chains 220, 320, 720, or 825 described with reference to FIGS. 2, 3, 5A, 5B, 6A, 6B, 7, and 8. The buffer 805-*a* may be an example of one or more aspects of first buffer 805 described with reference to FIG. 8.

The buffer 805-*a* may include a phase modification circuit 505-*g*, an input differential amplifier 905 and a tail current source 910. A distortion estimation circuit 810-*a* may supply a control voltage to the phase modification circuit 505-*g*. The control voltage from the distortion estimation circuit 810-*a* may be based on the estimated phase distortions of the signal path. The phase modification circuit 505-*g* may be an output matching network of the buffer 805-*a*.

The control voltage from the distortion estimation circuit 810-*a* may be applied to varactors 915-*a*, 915-*b*, 915-*c*, and 915-*d* in the phase modification circuit 505-*g*. The varactors 915-*a*, 915-*b*, 915-*c*, and 915-*d* each have a capacitance that may be adjusted based on the control voltage applied by the distortion estimation circuit 810-*a*. The control voltage from the distortion estimation circuit 810-*a* may be directly applied to the shunt varactors 915-*c* and 915-*d*. A scaled down version of the control voltage may be applied to the series varactors 915-*a* and 915-*b*. The scaling of the control voltage may be achieved with a voltage divider 920. The scaling of the control voltage may keep the output impedance and gain of the buffer 805-*a* constant. The changing capacitance of the varactors 915-*a*, 915-*b*, 915-*c*, and 915-*d* may produce a phase change to a LO signal being amplified by the buffer 805-*a*. The relationship between the control voltage and the phase change may be approximately linear.

Figure 10:
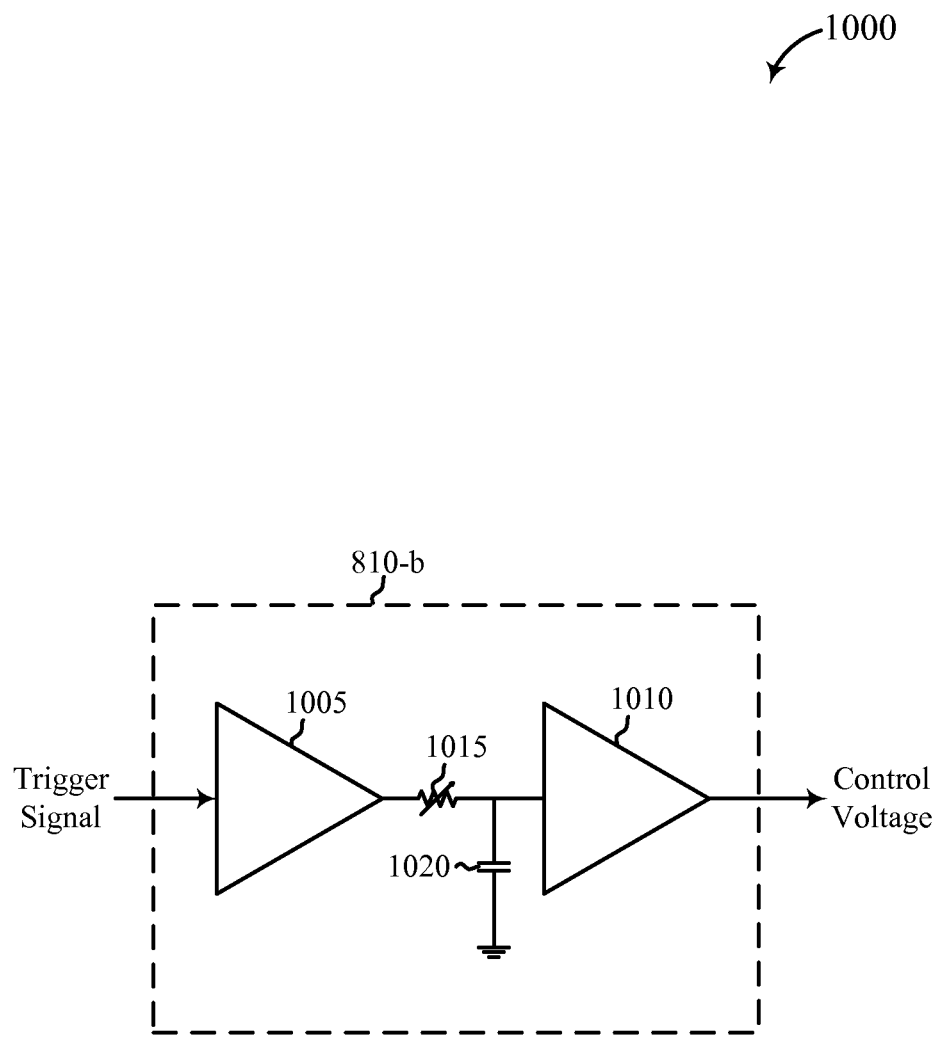
FIG. 10 is a block diagram of an exemplary control voltage circuit in the LO chain of a RF communication device, in accordance with various aspects of the present disclosure.

FIG. 10 is a block diagram 1000 of an exemplary distortion estimation circuit 810-*b* in the LO chain of a radio frequency (RF) communication device, in accordance with various aspects of the present disclosure. The RF communication device may be an example of the user terminals 130 described with reference to FIG. 1, or an example of a device used for other communications systems. The LO chain may be an example of one or more aspects of LO chains 220, 320, 720, or 825 described with reference to FIGS. 2, 3, 5A, 5B, 6A, 6B, 7, and 8. The distortion estimation circuit 810-*b* may be an example of one or more aspects of distortion estimation circuit 810 and/or 810-*a* described with reference to FIGS. 8 and 9.

The distortion estimation circuit 810-*b* may include a digital buffer 1005 and an analog buffer 1010. A trigger signal may be applied to the digital buffer 1005 to enable a control voltage. The digital buffer 1005 may output an initial voltage when the trigger signal is applied. The initial voltage may be set to a range of values based on the parameters of the digital buffer 1005. For example, the initial voltage from the digital buffer 1005 may be within the range of 0.5V to 2.5V with a 3 bit resolution. The initial voltage from the digital buffer 1005 may be shaped by a variable resistor 1015 and capacitor 1020. The initial voltage may be shaped based on the estimated phase distortion of the signal path. In some examples, the phase distortion of an example transmitter may be measured and used as an initial phase distortion. The change in phase distortion over time may then be estimated based on the initial phase distortion. The shaping of the initial voltage may be based on the estimate of how the initial phase distortion changes over time. The shaped voltage may then be amplified by the analog buffer 1010. In some examples, the analog buffer 1010 may have a unity gain. The analog buffer 1010 may then output the control voltage.

In some examples, the initial voltage may be shaped by the variable resistor 1015 and capacitor 1020 such that the control voltage output by the analog buffer has an exponential behavior over time. The exponential behavior may compensate for the non-linear behavior of the transient distortion in the signal path. This shaping may be applied if the input signal to the signal path is pulsed, which may cause the non-linear transient distortion. In this case, the estimated phase distortion may occur at the beginning of the pulse and then may settle to a final value over time. The control voltage may be shaped such that an opposite behavior is applied to the signal path to compensate for the estimated phase distortion.

Figure 11:
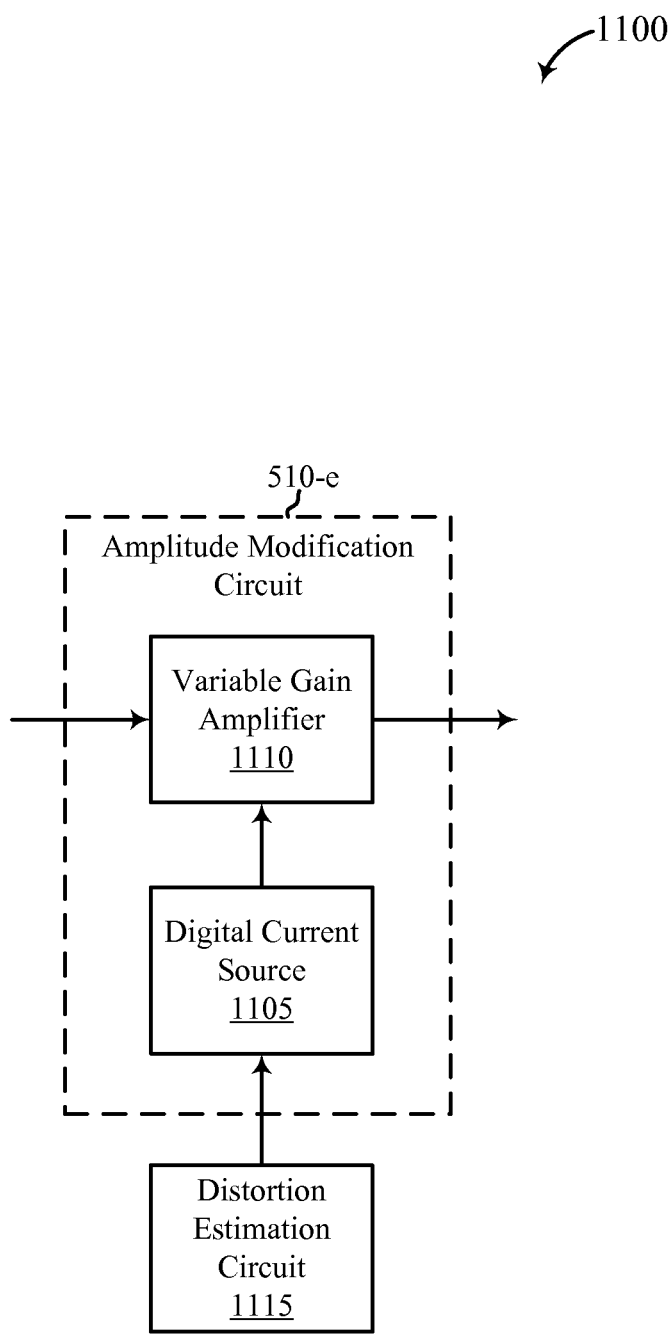
FIG. 11 is a block diagram of an exemplary amplitude modification circuit for a RF communication device, in accordance with various aspects of the present disclosure.

FIG. 11 is a block diagram 1100 of an exemplary amplitude modification circuit 510-*e* for a radio frequency (RF) communication device, in accordance with various aspects of the present disclosure. The RF communication device may be an example of the user terminals 130 described with reference to FIG. 1, or an example of a device used for other communications systems. The amplitude modification circuit 510-*e* may be an example of one or more aspects of amplitude modification circuits 410 or 510 described with reference to FIGS. 4, 5A, 5B, 6A, and 6B.

The amplitude modification circuit 510-*e* may include a digital current source 1105 and a variable gain amplifier 1110. The digital current source 1105 may adjust the gain of the variable gain amplifier 1110 by supplying an adjustable amount of current to the variable gain amplifier 1110. The amount of current supplied by the digital current source 1105 may be based on a signal from a distortion estimation circuit 1115. The distortion estimation circuit 1115 may determine an estimated amplitude distortion of the signal path. The variable gain amplifier 1110 may amplify the input signal along the signal path to compensate for the estimated amplitude distortion. The variable gain amplifier 1110 may have a linear phase response, so as to not affect the phase of the input signal.

Figure 12:
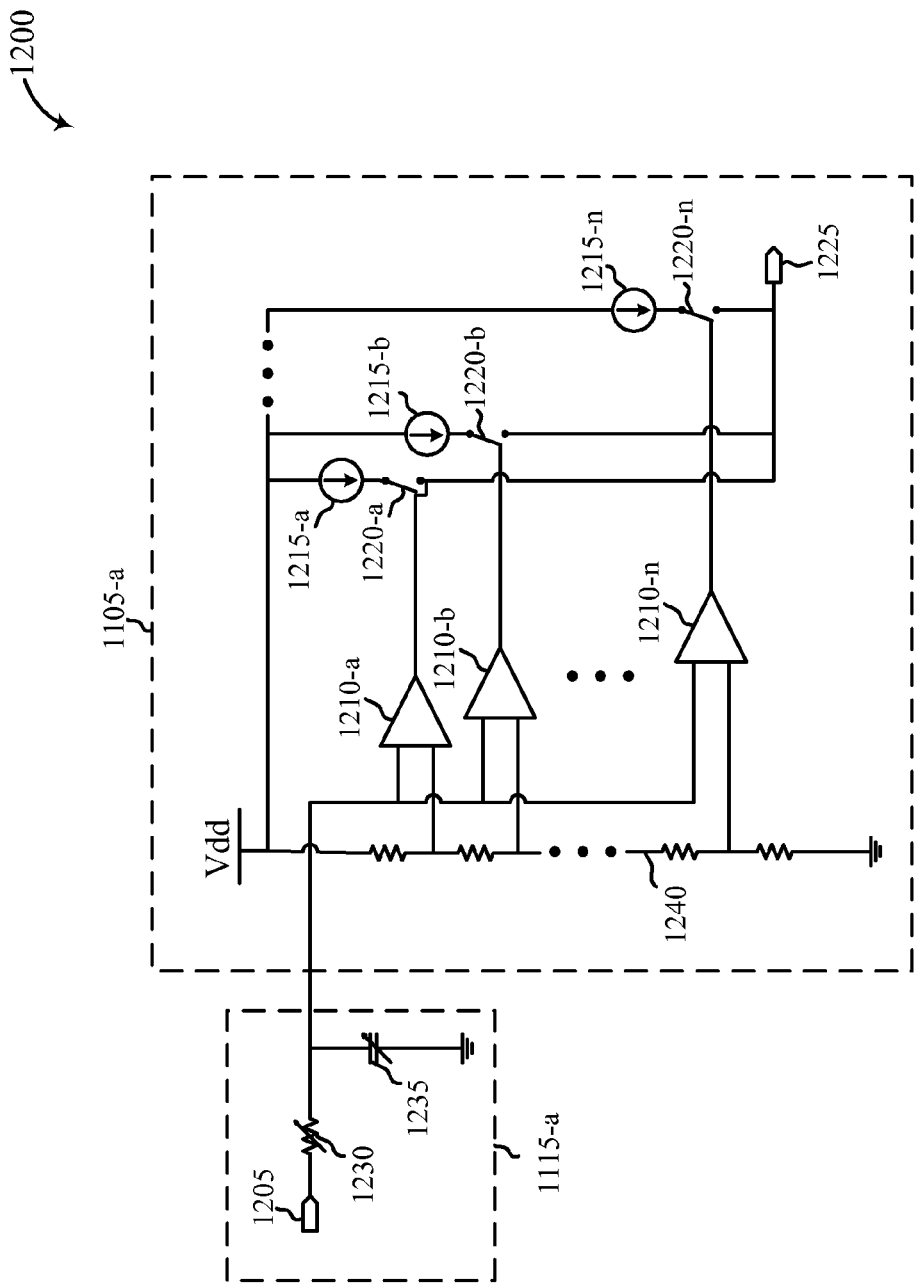
FIG. 12 is a block diagram of an exemplary digital current source in an amplitude modification circuit of a RF communication device, in accordance with various aspects of the present disclosure.

FIG. 12 is a block diagram 1200 of an exemplary digital current source 1105-*a* in an amplitude modification circuit of a radio frequency (RF) communication device, in accordance with various aspects of the present disclosure. The RF communication device may be an example of the user terminals 130 described with reference to FIG. 1, or an example of a device used for other communications systems. The amplitude modification circuit may be an example of one or more aspects of amplitude modification circuits 410 or 510 described with reference to FIGS. 4, 5A, 5B, 6A, 6B, and 11. The digital current source 1105-*a* may be an example of one or more aspects of digital current source 1105 described with reference to FIG. 11.

A trigger pulse may be applied to an input 1205 of a distortion estimation circuit 1115-*a*. The distortion estimation circuit 1115-*a* may be an example of one or more aspects of the distortion estimation circuit 1115 described with reference to FIG. 11. The trigger pulse may be shaped by a variable resistor 1230 and/or variable capacitor 1235. The trigger pulse may be shaped such that the resulting shaped signal has a shape that is approximately opposite to the estimated amplitude distortion of the signal path. A comparator network may digitize the shaped signal using resistor ladder 1240 and comparators 1210-*a* through 1210-*n*. The resolution of the digitized signal may be based on the number of comparators 1210 in the comparator network. The comparator network may enable current sources 1215-*a* through 1215-*n* by triggering switches 1220-*a* through 1220-*n*. The resistor ladder 1240 may scale the shaped signal, and each comparator 1210 may compare scaled signal to a reference voltage (e.g., voltage Vdd). Based on the result of the comparison, each comparator 1210 may enable or disable a corresponding current source 1215. In this way, the number of current sources 1215 that are enabled may be based on the amplitude of the shaped signal. As the amplitude increases, additional current sources 1215 may be enabled. The current from each of the enabled current sources 1215 may be summed and applied to output 1225. The total current at the output 1225 may be supplied to a variable gain amplifier.

Figure 13:
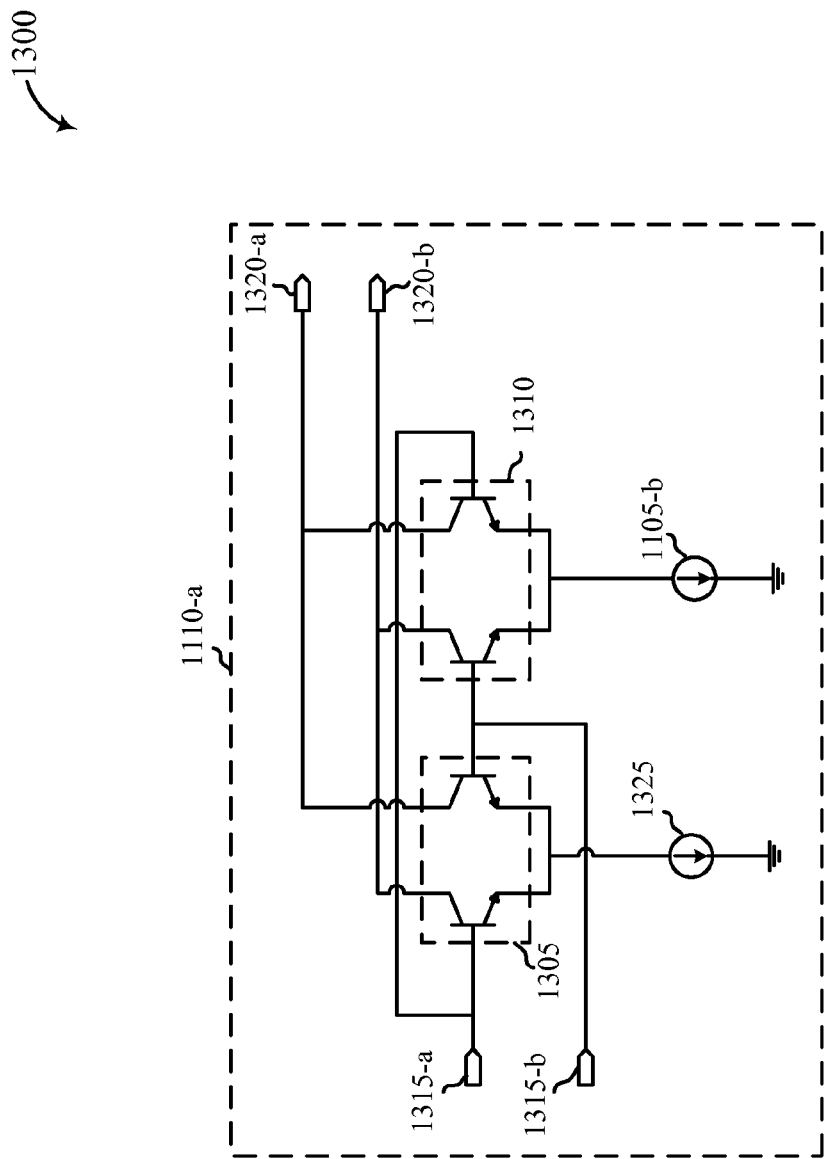
FIG. 13 is a block diagram of an exemplary variable gain amplifier in an amplitude modification circuit of a RF communication device, in accordance with various aspects of the present disclosure.

FIG. 13 is a block diagram 1300 of an exemplary variable gain amplifier 1110-*a* in an amplitude modification circuit of a radio frequency (RF) communication device, in accordance with various aspects of the present disclosure. The RF communication device may be an example of the user terminals 130 described with reference to FIG. 1, or an example of a device used for other communications systems. The amplitude modification circuit may be an example of one or more aspects of amplitude modification circuits 410 or 510 described with reference to FIGS. 4, 5A, 5B, 6A, 6B, and 11. The variable gain amplifier 1110-*a* may be an example of one or more aspects of variable gain amplifier 1110 described with reference to FIG. 11. The variable gain amplifier 1110-a may include a digital current source 1105-b, which may be an example of one or more aspects of digital current source 1105 and/or 1105-a described with reference to FIGS. 11 and 12.

The variable gain amplifier 1110-a may include a main amplifier 1305 and a secondary amplifier 1310. The main amplifier 1305 and secondary amplifier 1310 may be differential amplifiers. The secondary amplifier 1310 may be 180 degrees out of phase with the main amplifier 1305. A signal may be applied to positive input 1315-a and negative input 1315-b. The signal may be amplified by the main amplifier 1305 and secondary amplifier 1310, and then output at positive output 1320-a and negative output 1320-b.

A fixed current source 1325 may supply current to the main amplifier 1305, such that the main amplifier has a constant gain. The digital current source 1105-b may supply current to the secondary amplifier 1310. The gain of the secondary amplifier may vary based on the current from the digital current source 1105-b. The current from the digital current source 1105-b may be based on the estimated amplitude distortion of the signal path. In some examples, the variable gain applied by the secondary amplifier 1310 may be much weaker than the fixed gain applied by the main amplifier 1305. In this way, subtle adjustments to the amplitude of the input signal may be achieved without impacting the phase of the input signal. The adjustments to the amplitude of the input signal may compensate for the estimated amplitude distortion of the signal path.

Figure 14:
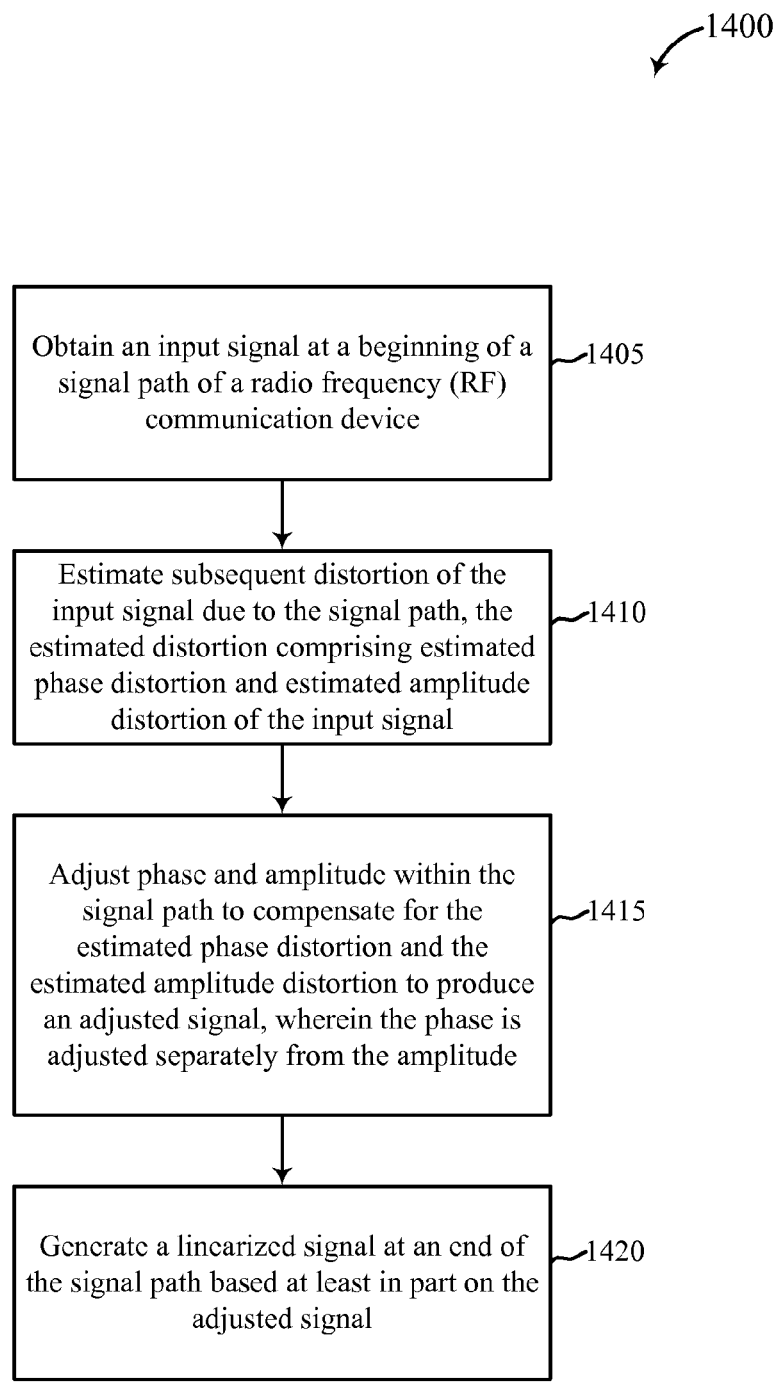
FIG. 14 is a flow chart illustrating an example of a method for linearizing a signal in an RF communication device, in accordance with various aspects of the present disclosure.

FIG. 14 is a flow chart illustrating an example of a method 1400 for linearizing a signal in an RF communication device, in accordance with various aspects of the present disclosure. For clarity, the method 1400 is described below with reference to aspects of one or more of the RF communication devices described with reference to FIGS. 1-13. In some examples, a RF communication device may perform one or more of the functions described below using purpose-built hardware or circuits.

At block 1405, the method 1400 may include obtaining an input signal at a beginning of a signal path of a RF communication device. In some examples, the input signal may be a pulsed signal.

In some examples, the method 1400 may include measuring a characteristic of the RF communication device. The characteristic may include the temperature of the RF communication device. The phase distortion and amplitude distortion due to the signal path may be estimated based on the measured characteristic.

At block 1410, the method 1400 may include estimating subsequent distortion of the input signal due to the signal path, the estimated distortion comprising estimated phase distortion and estimated amplitude distortion of the input signal. In some examples, at least one of the estimated phase distortion and the estimated amplitude distortion may include transient distortion. The transient distortion may be caused at least in part by power supply load changes of the RF communication device. The transient distortion may also be due at least in part to powering up of one or more components of the RF communication device. The transient distortion may also be due at least in part to a start of a pulse of the input signal.

At block 1415, the method 1400 may include adjusting phase and amplitude within the signal path to compensate for the estimated phase distortion and the estimated amplitude distortion to produce an adjusted signal, wherein the phase is adjusted separately from the amplitude. In some examples, the amplitude may be adjusted in a RF chain of the RF communication device. In some examples, at least part of the distortion of the input signal occurs after the input signal is adjusted.

In some examples, the method 1400 may include modifying at least one of the estimated phase distortion and the estimated amplitude distortion of the pulse due to changes in transient distortion. The transient distortion may change during a pulse of the input signal. At least one of phase and amplitude of the pulse may be further adjusted to compensate for the modified estimated phase distortion and the estimated amplitude distortion.

At block 1420, the method 1400 may include generating a linearized signal at an end of the signal path based at least in part on the adjusted signal. The linearized signal may compensate for the phase and amplitude distortion occurring in the signal path.

Thus, the method 1400 may provide for a linearized signal. It should be noted that the method 1400 is just one implementation and that the operations of the method 1400 may be rearranged or otherwise modified such that other implementations are possible.

Figure 15:
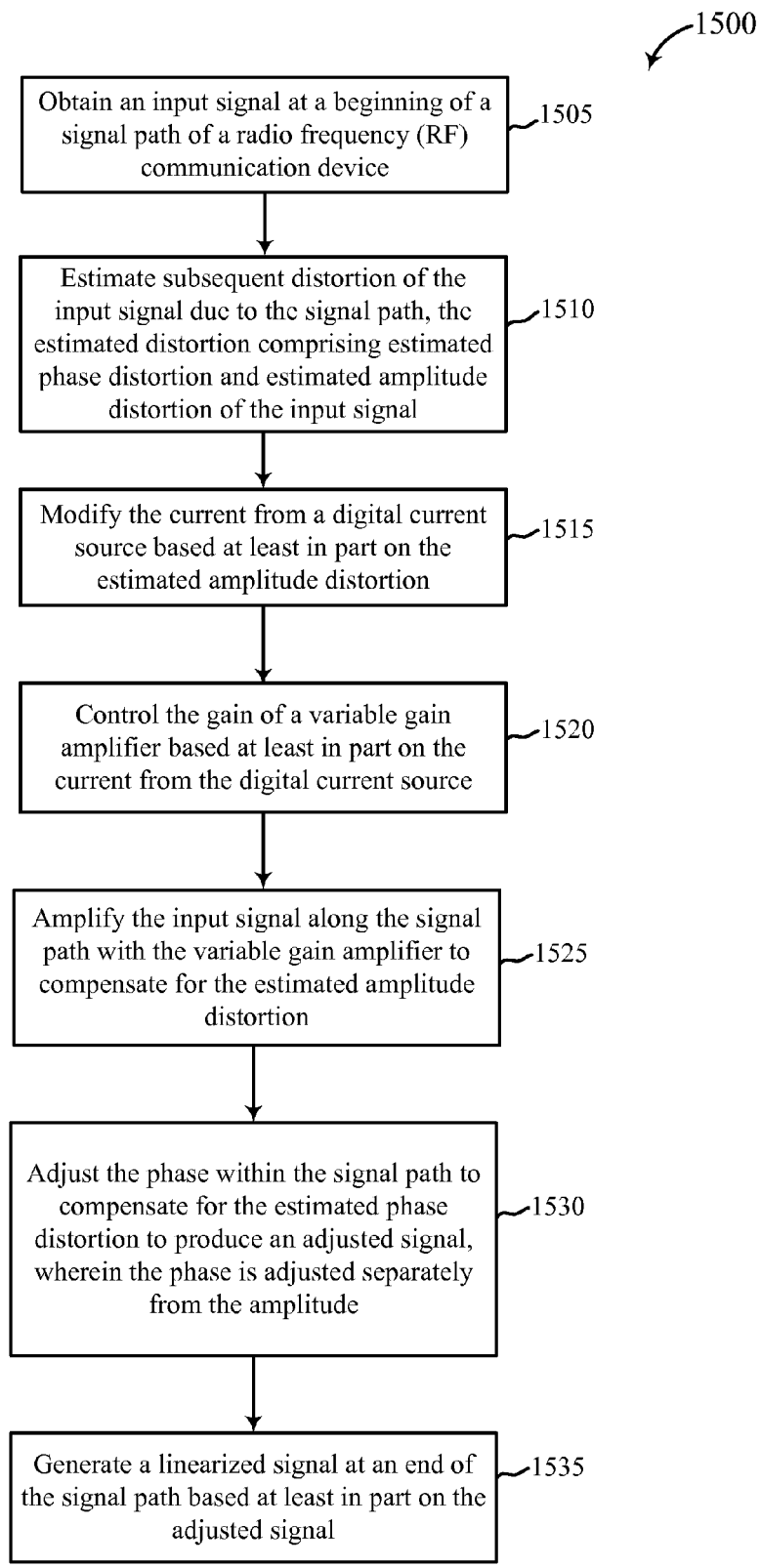
FIG. 15 is a flow chart illustrating still another example of a method for linearizing a signal in an RF communication device, in accordance with various aspects of the present disclosure.

FIG. 15 is a flow chart illustrating an example of a method 1500 for linearizing a signal in an RF communication device, in accordance with various aspects of the present disclosure. For clarity, the method 1500 is described below with reference to aspects of one or more of the RF communication devices described with reference to FIGS. 1-13. In some examples, a RF communication device may perform one or more of the functions described below using purpose-built hardware or circuits.

At block 1505, the method 1500 may include obtaining an input signal at a beginning of a signal path of a RF communication device. At block 1510, the method 1500 may include estimating subsequent distortion of the input signal due to the signal path, the estimated distortion comprising estimated phase distortion and estimated amplitude distortion of the input signal. At block 1515, the method 1500 may include modifying the current from a digital current source based at least in part on the estimated amplitude distortion. In some examples, the digital current source may include a plurality of current sources, and modifying the current from the digital current source may include enabling one or more of the plurality of current sources based at least in part on the estimated amplitude distortion and combining the currents from the one or more enabled current sources to form the current from the digital current source. In some examples, a trigger pulse to have an opposite shape of the estimated amplitude distortion. The shaped trigger pulse may then be digitized to with a comparator network to enable one or more of the plurality of current sources.

At block 1520, the method 1500 may include controlling the gain of a variable gain amplifier based at least in part on the current from the digital current source. In some examples, the variable gain amplifier may include a main amplifier and a secondary amplifier. In some examples, the gain of the variable gain amplifier may be controlled by modifying the gain of the secondary amplifier based at least in part on the current of the digital current source. The input signal may be amplified with the main amplifier and the secondary amplifier, and the secondary amplifier may be 180° out of phase with the main amplifier.

At block 1525, the method 1500 may include amplifying the input signal along the signal path with the variable gain amplifier to compensate for the estimated amplitude distortion. At block 1530, the method 1500 may include adjusting the phase within the signal path to compensate for the estimated phase distortion to produce an adjusted signal, wherein the phase is adjusted separately from the amplitude. At block 1535, the method 1500 may include generating a linearized signal at an end of the signal path based at least in part on the adjusted signal. The linearized signal may compensate for the phase and amplitude distortion occurring in the signal path.

Thus, the method 1500 may provide for a linearized signal. It should be noted that the method 1500 is just one implementation and that the operations of the method 1500 may be rearranged or otherwise modified such that other implementations are possible.

Figure 16:
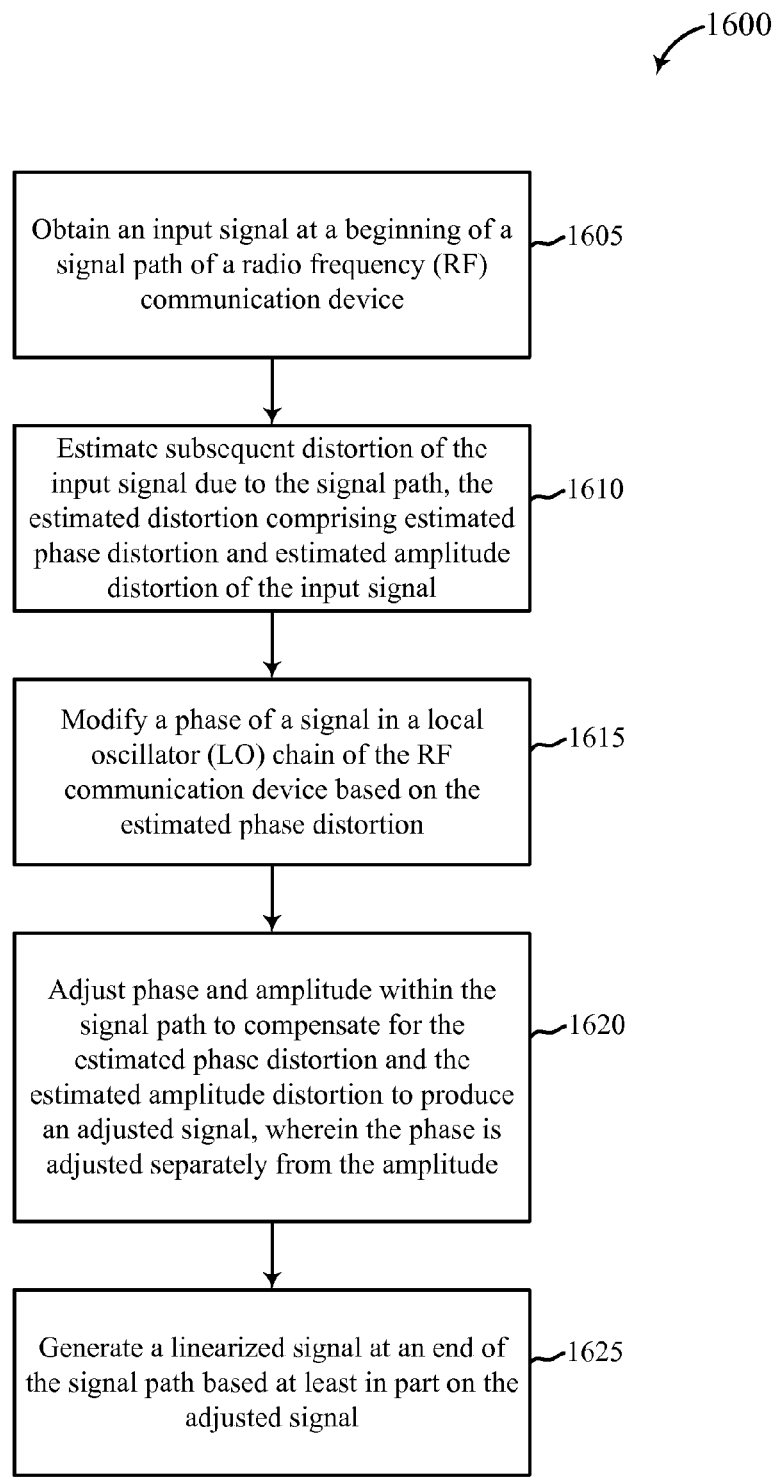
FIG. 16 is a flow chart illustrating another example of a method for linearizing a signal in an RF communication device, in accordance with various aspects of the present disclosure.

FIG. 16 is a flow chart illustrating an example of a method 1600 for linearizing a signal in an RF communication device, in accordance with various aspects of the present disclosure. For clarity, the method 1600 is described below with reference to aspects of one or more of the RF communication devices described with reference to FIGS. 1-13. In some examples, a RF communication device may perform one or more of the functions described below using purpose-built hardware or circuits.

At block 1605, the method 1600 may include obtaining an input signal at a beginning of a signal path of a RF communication device. At block 1610, the method 1600 may include estimating subsequent distortion of the input signal due to the signal path, the estimated distortion comprising estimated phase distortion and estimated amplitude distortion of the input signal.

At block 1615, the method 1600 may include modifying a phase of a signal in a local oscillator (LO) chain of the RF communication device based on the estimated phase distortion. In some examples, the phase of the LO signal may be modified by shaping a biasing voltage of an amplifier in the LO chain and saturating at least one subsequent amplifier in the LO chain to preserve the amplitude and modified phase of the LO signal. In some examples, the phase of the LO signal may be modified by an output matching network of the LO chain. In some examples, the output matching network may include a plurality of varactors, and the phase of the LO signal may be modified by applying a control voltage to the plurality of varactors. The control voltage may be scaled and applied to a subset of the plurality of varactors. In some examples, the control voltage may be shaped based at least in part on the estimated phase distortion.

At block 1620, the method 1600 may include adjusting phase and amplitude of the input signal along the signal path to compensate for the estimated phase distortion and the estimated amplitude distortion to produce an adjusted signal, wherein the phase of the input signal is adjusted separately from the amplitude of the input signal. In some examples, the phase of the input signal may be adjusted by applying the modified LO signal to the input signal. At block 1865, the method 1600 may include generating a linearized signal at an end of the signal path based at least in part on the adjusted signal. The linearized signal may compensate for the phase and amplitude distortion occurring in the signal path.

Thus, the method 1600 may provide for a linearized signal. It should be noted that the method 1600 is just one implementation and that the operations of the method 1600 may be rearranged or otherwise modified such that other implementations are possible.

In some examples, aspects from two or more of the methods 1400, 1500, or 1600 may be combined. It should be noted that the methods 1400, 1500, and 1600 are just example implementations, and that the operations of the methods 1400, 1500, and 1600 may be rearranged or otherwise modified such that other implementations are possible.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method comprising:
   obtaining an input signal at a beginning of a signal path of a radio frequency (RF) communication device;
   estimating subsequent distortion of the input signal due to the signal path, the estimated distortion comprising estimated phase distortion and estimated amplitude distortion of the input signal;
   adjusting phase and amplitude within the signal path to compensate for the estimated phase distortion and the estimated amplitude distortion to produce an adjusted signal, wherein the phase is adjusted separately from the amplitude,
   wherein the adjusting the phase and amplitude of the input signal comprises:
      adjusting the phase of the input signal with a phase modification circuit of the RF communication device, wherein the adjusting the phase of the input signal with the phase modification circuit comprises:
         modifying a phase of a signal in a local oscillator (LO) chain of the RF communication device based on the estimated phase distortion; and
         applying the modified LO signal to the input signal; and
      adjusting the amplitude of the input signal with an amplitude modification circuit of the RF communication device, wherein the amplitude modification circuit is separate from the phase modification circuit; and
   generating a linearized signal at an end of the signal path based at least in part on the adjusted signal.

2. The method of claim 1, wherein at least one of the estimated phase distortion and the estimated amplitude distortion include transient distortion.

3. The method of claim 2, wherein the transient distortion is due at least in part to a start of a pulse of the input signal.

4. The method of claim 3, wherein the transient distortion changes during the pulse of the input signal, and the method further comprises:
   modifying at least one of the estimated phase distortion and the estimated amplitude distortion of the pulse due to the changes in the transient distortion; and
   further adjusting at least one of phase and amplitude of the pulse to compensate for the modified estimated phase distortion and the estimated amplitude distortion.

5. The method of claim 2, wherein the transient distortion is caused at least in part by power supply load changes of the RF communication device.

6. The method of claim 2, wherein the transient distortion is due at least in part to powering up of one or more components of the RF communication device.

7. The method of claim 1, wherein estimating the subsequent distortion comprises:
   measuring a characteristic of the RF communication device; and
   estimating the phase distortion and the amplitude distortion based on the measured characteristic.

8. The method of claim 7, wherein the characteristic is a temperature of the RF communication device.

9. The method of claim 1, wherein at least part of the distortion of the input signal occurs after the input signal is adjusted.

10. The method of claim 1, wherein generating the linearized signal compensates for phase and amplitude distortion occurring in the signal path.

11. A method comprising:
    obtaining an input signal at a beginning of a signal path of a radio frequency (RF) communication device;
    estimating subsequent distortion of the input signal due to the signal path, the estimated distortion comprising estimated phase distortion and estimated amplitude distortion of the input signal;
    adjusting phase and amplitude within the signal path to compensate for the estimated phase distortion and the estimated amplitude distortion to produce an adjusted signal, wherein the phase is adjusted separately from the amplitude,
    wherein the adjusting the phase and amplitude of the input signal comprises:
       adjusting the phase of the input signal with a phase modification circuit of the RF communication device;
       adjusting the amplitude of the input signal with an amplitude modification circuit of the RF communication device, wherein the amplitude modification circuit is separate from the phase modification circuit, and wherein adjusting the amplitude of the input signal with the amplitude modification circuit comprises:
          modifying the current from a digital current source based at least in part on the estimated amplitude distortion;
          controlling the gain of a variable gain amplifier based at least in part on the current from the digital current source; and
          amplifying the input signal with the variable gain amplifier; and
    generating a linearized signal at an end of the signal path based at least in part on the adjusted signal.

12. The method of claim 11, wherein the digital current source comprises a plurality of current sources, and modifying the current from the digital current source comprises:
    enabling one or more of the plurality of current sources based at least in part on the estimated amplitude distortion; and combining the currents from the one or more enabled current sources to form the current from the digital current source.

13. The method of claim 11, wherein the variable gain amplifier comprises a main amplifier and a secondary amplifier, and controlling the gain of the variable gain amplifier comprises:
modifying the gain of the secondary amplifier based at least in part on the current of the digital current source; and
amplifying the input signal with the main amplifier and the secondary amplifier.

14. The method of claim 1, wherein modifying the phase of the LO signal comprises:
shaping a biasing voltage of an amplifier in the LO chain; and
saturating at least one subsequent amplifier in the LO chain to preserve the amplitude and modified phase of the LO signal.

15. The method of claim 1, wherein the phase of the LO signal is modified by an output matching network of the LO chain.

16. A radio frequency (RF) communication device comprising:
a signal path of an input signal, the signal path including a beginning and an end;
a distortion estimation circuit to generate a distortion estimation signal, the distortion estimation signal indicating an estimated distortion of the input signal between the beginning and the end of the signal path, the estimated distortion comprising estimated phase distortion and estimated amplitude distortion of the input signal;
an amplitude modification circuit to adjust, based at least in part on the distortion estimation signal, amplitude within the signal path to compensate for the estimated amplitude distortion; and
a phase modification circuit to adjust, based at least in part on the distortion estimation signal, phase within the signal path to compensate for the estimated phase distortion, wherein the phase is adjusted separately from the amplitude to generate a linearized signal at the end of the signal path,
wherein the phase modification circuit adjusts the phase within the signal path by:
modifying a phase of a signal in a local oscillator (LO) chain of the RF communication device based on the distortion estimation signal; and
applying the modified LO signal to the input signal,
and wherein the amplitude modification circuit is separate from the phase modification circuit.

17. The RF communication device of claim 16, wherein at least one of the estimated phase distortion and the estimated amplitude distortion include transient distortion.

18. The RF communication device of claim 16, wherein at least part of the distortion of the input signal occurs after the input signal is adjusted.

19. A radio frequency (RF) communication device comprising:
a signal path of an input signal, the signal path including a beginning and an end;
a distortion estimation circuit to generate a distortion estimation signal, the distortion estimation signal indicating an estimated distortion of the input signal between the beginning and the end of the signal path, the estimated distortion comprising estimated phase distortion and estimated amplitude distortion of the input signal;
an amplitude modification circuit to adjust, based at least in part on the distortion estimation signal, amplitude within the signal path to compensate for the estimated amplitude distortion; and
a phase modification circuit to adjust, based at least in part on the distortion estimation signal, phase within the signal path to compensate for the estimated phase distortion, wherein the phase is adjusted separately from the amplitude to generate a linearized signal at the end of the signal path; and
wherein the amplitude modification circuit is separate from the phase modification circuit.

20. The RF communication device of claim 19, wherein the amplitude modification circuit comprises:
a digital current source supplying a current based at least in part on the distortion estimation signal; and
a variable gain amplifier having a gain based at least in part on the current from the digital current source, wherein the variable gain amplifier amplifies the input signal.

21. The RF communication device of claim 20, wherein the digital current source comprises a plurality of current sources, and the current from the digital current source is supplied by:
enabling one or more of the plurality of current sources based at least in part on the distortion estimation signal; and
combining the currents from the one or more enabled current sources to form the current from the digital current source.

22. The RF communication device of claim 20, wherein the variable gain amplifier comprises a main amplifier and a secondary amplifier, and the gain of the variable gain amplifier is modified by:
modifying the gain of the secondary amplifier based at least in part on the current of the digital current source; and
amplifying the input signal with the main amplifier and the secondary amplifier.

23. The RF communication device of claim 16, wherein the phase modification circuit comprises an output matching network, and the output matching network modifies the phase of the LO signal.

* * * * *